`(12)` United States Patent
Ishii et al.

(10) Patent No.: US 7,385,224 B2
(45) Date of Patent: Jun. 10, 2008

(54) THIN FILM TRANSISTOR HAVING AN ETCHING PROTECTION FILM AND MANUFACTURING METHOD THEREOF

(75) Inventors: Hiromitsu Ishii, Mitaka (JP); Hitoshi Hokari, Hachioji (JP); Motohiko Yoshida, Fussa (JP); Ikuhiro Yamaguchi, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 97 days.

(21) Appl. No.: 11/219,171

(22) Filed: Sep. 1, 2005

(65) Prior Publication Data

US 2006/0043447 A1 Mar. 2, 2006

(30) Foreign Application Priority Data

Sep. 2, 2004 (JP) ............................. 2004-255307
Dec. 28, 2004 (JP) ............................. 2004-378476

(51) Int. Cl.
*H01L 27/14* (2006.01)
*H01L 29/04* (2006.01)
*H01L 29/15* (2006.01)
*H01L 31/036* (2006.01)

(52) U.S. Cl. .......................................... 257/72; 257/59
(58) Field of Classification Search .................. 257/72, 257/43, 59
See application file for complete search history.

(56) References Cited

U.S. PATENT DOCUMENTS 5,396,354 A * 3/1995 Shimada et al. ............... 349/41
5,474,941 A * 12/1995 Mitani et al. ................ 438/151
5,712,494 A * 1/1998 Akiyama et al. .............. 257/59
6,184,960 B1 * 2/2001 Sawayama et al. ......... 349/139
2001/0030170 A1 10/2001 Takaki et al.

(Continued)

FOREIGN PATENT DOCUMENTS

JP 60-88471 A 5/1985

(Continued)

OTHER PUBLICATIONS

English translation of JP 60-088471.*

(Continued)

*Primary Examiner*—Jerome Jackson
*Assistant Examiner*—Anthony Ho
(74) *Attorney, Agent, or Firm*—Frishauf, Holtz, Goodman & Chick, P.C.

(57) ABSTRACT

A thin film transistor of the present invention includes a semiconductor thin film (8); a gate insulating film (7) formed on one surface of the semiconductor thin film (8); a gate electrode (6) formed to be opposite to the semiconductor thin film (8) through the gate insulating film (7); a source electrode (15) and a drain electrode (16) electrically connected to the semiconductor thin film (8); a source region; a drain region; and a channel region. The thin film transistor further includes an insulating film (9) formed on a peripheral portion corresponding to at least the source region and the drain region of the semiconductor thin film (8), and having a contact hole (10, 11) through which at least a part of each of the source region and the drain region is exposed wherein the source electrode (15) and the drain electrode (16) are connected to the semiconductor thin film (8) through the contact hole (10, 11).

16 Claims, 24 Drawing Sheets

U.S. PATENT DOCUMENTS

| | | |
|---|---|---|
| 2002/0033484 A1* | 3/2002 | Jeong et al. .................. 257/72 |
| 2003/0047785 A1 | 3/2003 | Kawasaki et al. |
| 2004/0007748 A1* | 1/2004 | Sakama et al. ............. 257/410 |
| 2004/0155270 A1 | 8/2004 | Hoffman |
| 2004/0155846 A1 | 8/2004 | Hoffman et al. |

FOREIGN PATENT DOCUMENTS

| | | |
|---|---|---|
| JP | 60-134471 A | 7/1985 |
| JP | 05-067786 A | 3/1993 |
| TW | 548499 | 8/2003 |

OTHER PUBLICATIONS

Nishino J. et al, "Etching of Zinc Oxide Films by Acetylacetone" Journal of the Ceramic Society of Japan, International Edition, Fuji Technology Press, Tokyo, JP, vol. 103, No. 1, Jan. 1995, pp. 85-87, XP000521843, ISN: 0912-9200.

* cited by examiner

THIN FILM TRANSISTOR HAVING AN ETCHING PROTECTION FILM AND MANUFACTURING METHOD THEREOF

This application is based on Japanese Patent Application No. 2004-255307 filed on Sep. 2, 2004 and Japanese Patent Application No. 2004-378476 filed on Dec. 28, 2004 and including specification, claims, drawings and summary. The disclosures of the above Japanese Patent Applications are incorporated herein by reference in their entireties.

BACKGROUND OF THE INVENTION

1. Field of the Invention

The present invention relates to a thin film transistor having an etching protection film and manufacturing method thereof.

2. Description of the Related Art

Unexamined Japanese Patent Application KOKAI Publication H 5-67786 discloses a structure as a thin film transistor used as a switching element of an active matrix liquid crystal display device. The thin film transistor includes a gate electrode formed on an upper surface of an insulating substrate, a gate insulating film formed on the upper surface of the insulating film including the gate electrode, an intrinsic amorphous silicon semiconductor thin film formed on an upper surface of the gate insulating film on the gate electrode, a channel protection film formed on a central portion of an upper surface of the semiconductor thin film, n-type amorphous silicon ohmic contact layers formed on both sides of an upper surface of the channel protection film and an upper surface of the semiconductor thin film on its both sides, and a source and drain electrode formed on an upper surface of each ohmic contact layer.

In recent years, the use of a metal oxide semiconductor such as a zinc oxide (ZnO) instead of amorphous silicon has been considered in view of higher mobility. The manufacturing method of the thin film transistor using the metal oxide semiconductor can be considered as follows. For example, an intrinsic ZnO semiconductor thin film forming layer is film-formed on a gate insulating film, and a silicon nitride channel protection film is pattern formed on the semiconductor thin film forming layer. Next, an n-type ZnO ohmic layer forming layer is film-formed on an upper surface of the semiconductor thin film forming layer including the channel protection film, and the ohmic contact layer forming layer and the semiconductor thin film forming layer are continuously pattern formed to form an ohmic contact layer and a semiconductor thin film on a device area. Sequentially, a source and drain electrode is pattern formed on an upper surface of each ohmic contact layer.

However, in the aforementioned manufacturing method, there is a problem in which the zinc oxide easily dissolves in both acid and alkali and its etching resistance is extremely low, thereby causing relatively large side etching in the ZnO semiconductor thin film and the ohmic contact layer formed on the device area in post-process to worsen machining accuracy.

SUMMARY OF THE INVENTION

In view of the aforementioned problem, an object of the present invention is to provide a thin film transistor and its manufacturing method that can improve machining accuracy.

In order to attain the above object, a thin film transistor according to the present invention includes a semiconductor thin film; a gate insulating film formed on one surface of the semiconductor thin film; a gate electrode formed to be opposite to the semiconductor thin film through the gate insulating film; a source electrode and a drain electrode electrically connected to the semiconductor thin film; a source region; a drain region; and a channel region. The thin film transistor further includes an insulating film formed on a peripheral portion at least in the source region and the drain region of the semiconductor thin film, and having a contact hole through which at least a part of each of the source region and the drain region is exposed; and wherein the source electrode and the drain electrode are connected to the semiconductor thin film through the contact hole.

Moreover, a thin film transistor manufacturing method according to the present invention includes forming a gate electrode, a gate insulating film and a semiconductor thin film; forming an insulating film on the semiconductor thin film; etching the semiconductor thin film and the insulating film to form the insulating film that exposes at least a part of each of a source region and a drain region of the semiconductor thin film on at least peripheral portions of the source region and the drain region; and forming the source electrode and the drain electrode connected to the semiconductor thin film exposed from the insulating film.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1A:
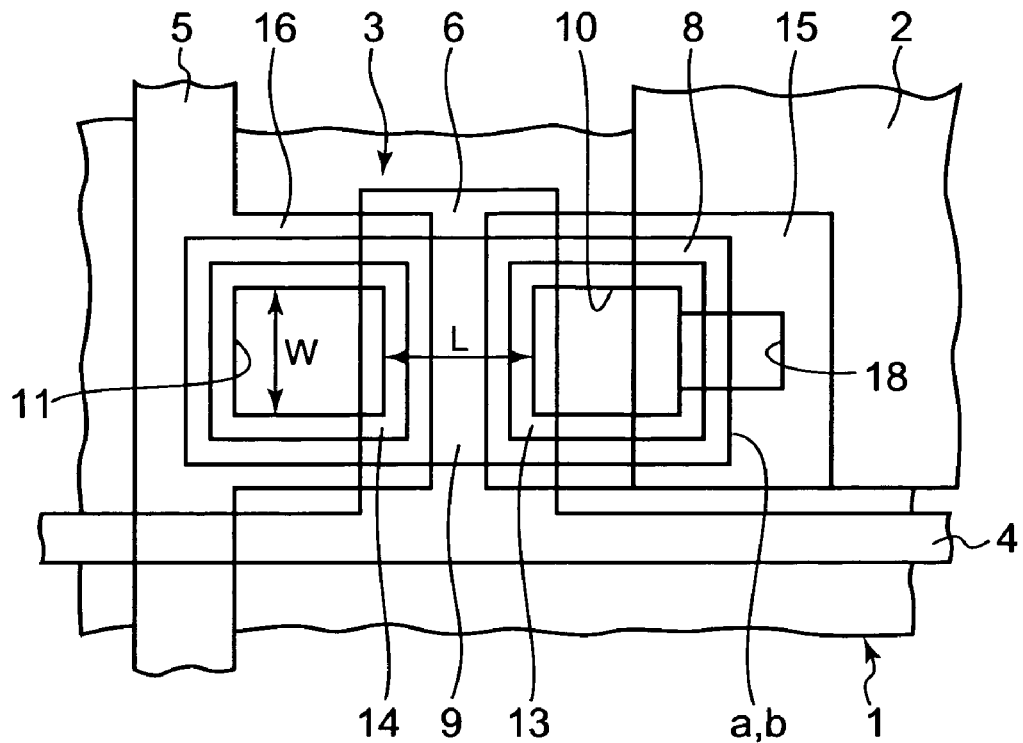
FIG. 1A is a transparent plan view illustrating a principal part of a liquid crystal display device having a thin film transistor according to a first embodiment of the present invention.
Figure 1B:
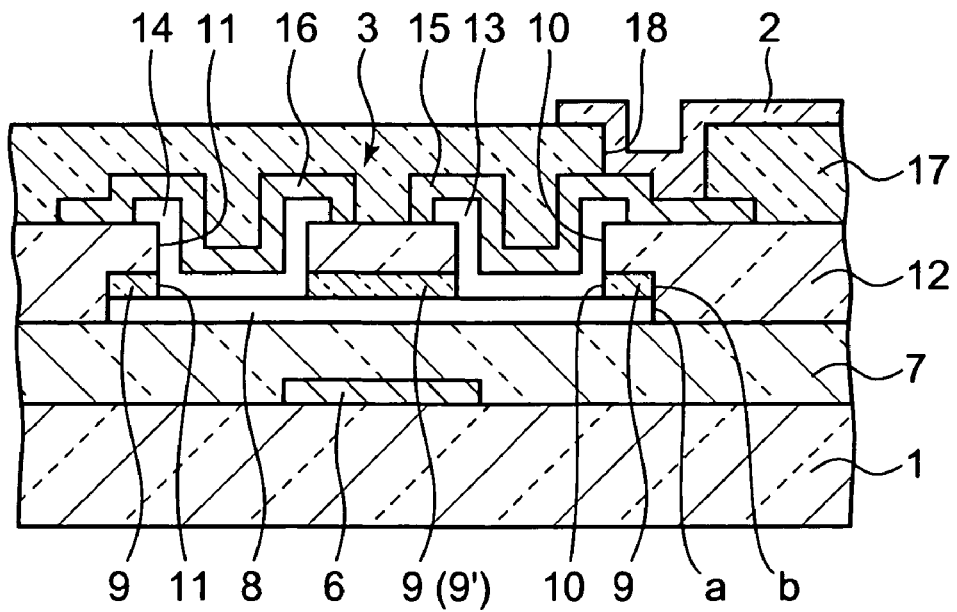
FIG. 1B is a cross sectional view cut along a substantially central line in a channel width direction of the thin film transistor illustrated in FIG. 1A.

FIG. 1A is a transparent plan view illustrating a principal part of a liquid crystal display device having a thin film transistor according to a first embodiment of the present invention, and FIG. 1B is a cross sectional view cut along a substantially central line in a channel width direction of the thin film transistor illustrated in FIG. 1A. Additionally, in each of FIGS. 2 to 24 explained below, each of 2B to 24B shows a cross sectional view cut along a substantially central line in a channel width direction of the thin film transistor illustrated in each of FIGS. 2A to 24A. The liquid crystal display device includes a glass substrate 1. On the glass substrate 1, there are formed multiple pixel electrodes 2 arranged in matrix, thin film transistors 3 connected to the pixel electrodes 2, respectively, scanning lines 4 arranged in rows to supply a scanning signal to each thin film transistor 3, and data lines 5 arranged in columns to supply a data signal to each thin film transistor 3.

In other words, on a predetermined portion of the upper surface of the glass substrate 1, there is formed the scanning line 4 including a gate electrode 6 made of metal such as chromium, aluminum, etc. On the upper surface of the glass electrode 1 including the gate electrode 6 and the scanning line 4, a gate insulating film 7 made of silicon nitride is formed. On a predetermined portion of the upper surface of the gate insulating film 7 on the gate electrode 6, a semiconductor thin film 8 made of intrinsic zinc oxide is formed.

A protection film (insulating film) 9 made of silicon nitride is formed on an upper surface central portion, corresponding to a channel region of the semiconductor thin film 8, and a peripheral portion thereof. The protection film 9 has a central portion 9', which is formed on the channel region of the semiconductor thin film 8, and a portion formed on the peripheral portion of the semiconductor thin film 8. The portion formed on the peripheral portion of the semiconductor thin film 8 has a peripheral portion with an end surface b having the same shape as that of an end surface a in a channel direction of the semiconductor thin film 8. Namely, in the thin film transistor, the central portion 9' of the protection film 9 formed on the semiconductor thin film 8 serves as a channel region. A right region of the protection portion 9' in FIG. 1B serves as a source region. A left region of the protection portion 9' in FIG. 1B serves as a drain region. Moreover, the protection film 9 has contact holes 10 and 11 of a square shape for exposing the source region and the drain region of the semiconductor thin film 8.

On the upper surface of the gate insulating film 7 including the protection film 9 and the semiconductor thin film 8, an upper insulating film 12 made of silicon nitride is formed. In this case, the upper insulating film 12 has contact holes 10 and 11 that are continuous to the holes 10 and 11 of the protection holes 10 and 11.

On an upper surface of the source region of the semiconductor thin film 8 exposed through one contact hole 10 and an upper surface of the upper insulating film 12 near the source region, one ohmic contact layer 13 made of n-type zinc oxide is formed. On an upper surface of the drain region of the semiconductor thin film 8 exposed through the other contact hole 11 and an upper surface of the upper insulating film 12 near the drain region, the other ohmic contact layer 14 made of n-type zinc oxide is formed.

On an upper surface of one ohmic contact layer 13 and the upper surface of the upper insulating film 12 near the ohmic contact layer 13, a source electrode 15, made of metal such as chromium, aluminum, ITO, etc., is formed. On an upper surface of the other ohmic contact layer 14 and a predetermined portion of the upper surface of the upper insulating film 12, a data line 5 including a drain electrode 16, made of metal such as chromium, aluminum, ITO, etc., is formed. In this case, the ohmic contact layers 13 and 14 are completely covered with the source electrode 15 and the drain electrode 16.

Thus, the thin film transistor 3 is formed of the gate electrode 6, the gate insulating film 7, the semiconductor thin film 8, the protection film 9, the ohmic contact layers 13 and 14, the source electrode 15, and the drain electrode 16.

Then, a size of the semiconductor thin film 8 covered with the protection film 9 between two contact holes 10 and 11 in the right and left directions in FIG. 1A, namely, a space between the contact holes 10 and 11, corresponds to a channel length L. Furthermore, for example, a connection portion between the drain electrode 16 including the other ohmic contact layer 14 and the semiconductor thin film 8, namely, a size of the other contact hole 11 in the upper and lower directions (direction orthogonal to the space between two contact holes 10 and 11) in FIG. 1A corresponds to a channel width W.

On the upper surface of the gate insulating film 7 including the thin film transistor 3, a silicon nitride overcoat film 17 is formed. On a predetermined portion of an upper portion of the overcoat film 17, a pixel electrode 2, made of transparent conductive material such as ITO, etc., is formed. The pixel electrode 2 is connected to the source electrode 15 through a contact hole 18 formed on a predetermined portion of the overcoat film 17.

Figure 2A:
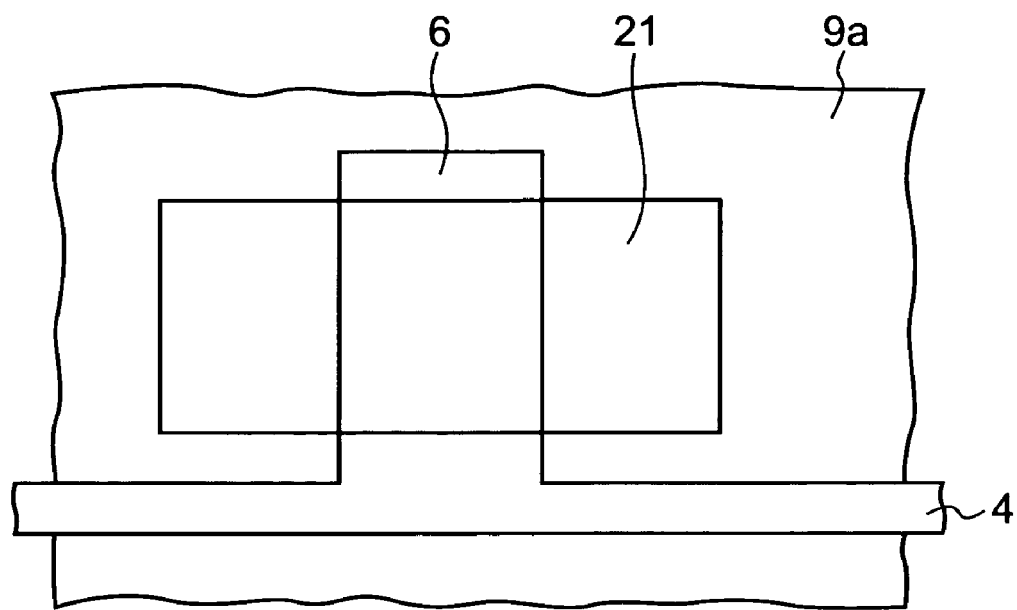
FIG. 2A is a transparent plan view illustrating an initial process in manufacturing the thin film transistor part illustrated in FIG. 1A and 1B.
Figure 2B:
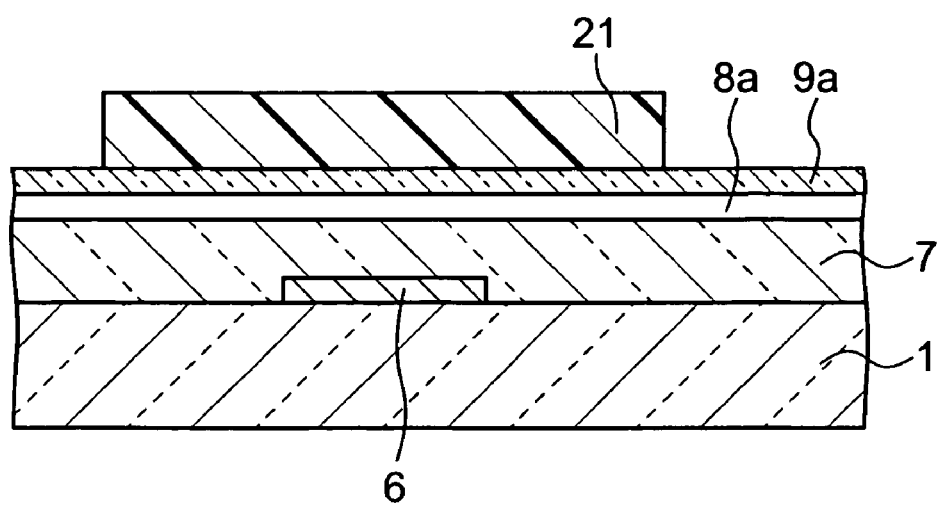
FIG. 2B is a cross sectional view cut along a substantially central line in a channel width direction of the thin film transistor illustrated in FIG. 2A.

An explanation will be next given of an example of a method for manufacturing a part of the thin film transistor 3 in the liquid crystal display device. First of all, as illustrated in FIGS. 2A and 2B, on a predetermined portion of the upper surface of the glass substrate 1, a metal layer, which is film-formed by sputtering and which is made of metal such as chromium, aluminum, etc, is patterned by photolithography, thereby forming the scanning line 4 including the gate electrode 6.

Next, a gate insulating film 7 made of silicon nitride, a semiconductor thin film forming layer 8a made of intrinsic zinc oxide, and a protection film forming layer 9a made of silicon nitride are continuously film-formed on the upper surface of the glass substrate 1 including the gate electrode 6 and the scanning line 4 by plasma CVD (Chemical Vapor Deposition). After that, on an upper surface of the protection film forming layer 9a, a device area forming resist pattern 21 is formed by photolithography.

Figure 3A:
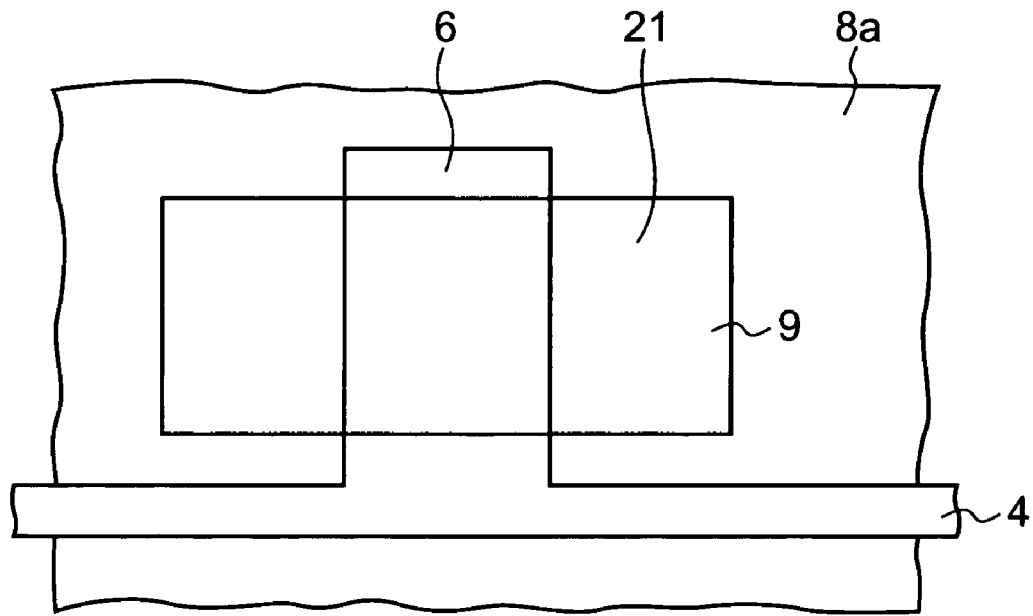
FIG. 3A is a transparent plan view illustrating a process subsequent to FIGS. 2A and 2B.
Figure 3B:
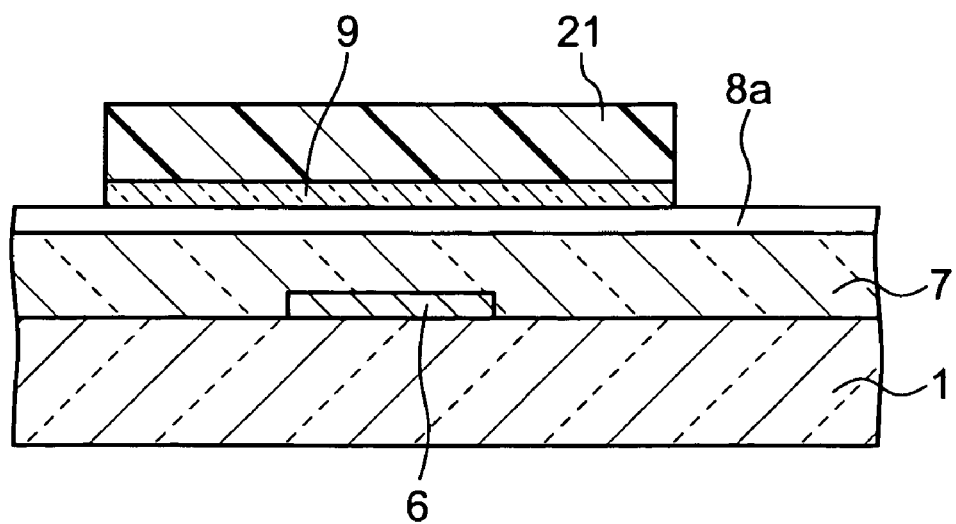
FIG. 3B is a cross sectional view cut along a substantially central line in a channel width direction of the thin film transistor illustrated in FIG. 3A.

Sequentially, when the protection film forming layer 9a is etched using the resist pattern 21 as a mask, the protection film 9 is formed under the resist pattern 21 as illustrated in FIGS. 3A and 3B. In this case, a surface of the semiconductor thin film forming layer 8a in the region except the portion under the resist pattern 21 is exposed. Regarding the method for etching the protection film forming layer 9a made of silicon nitride, a reactive plasma etching (dry etching) using sulfur hexafluoride ($SF_6$) is favorable so as not to penetrate into the semiconductor thin film forming layer 8a made of intrinsic zinc oxide as much as possible while also ensuring a fast speed of etching the protection film forming layer 9a.

Next, the resist pattern 21 is stripped using a resist stripper. In this case, the surface of the semiconductor thin film forming layer 8a in the region except the portion under the protection film 9 is exposed to the resist stripper. However, since the exposed portion is a non-device area, there is no trouble.

Figure 4A:
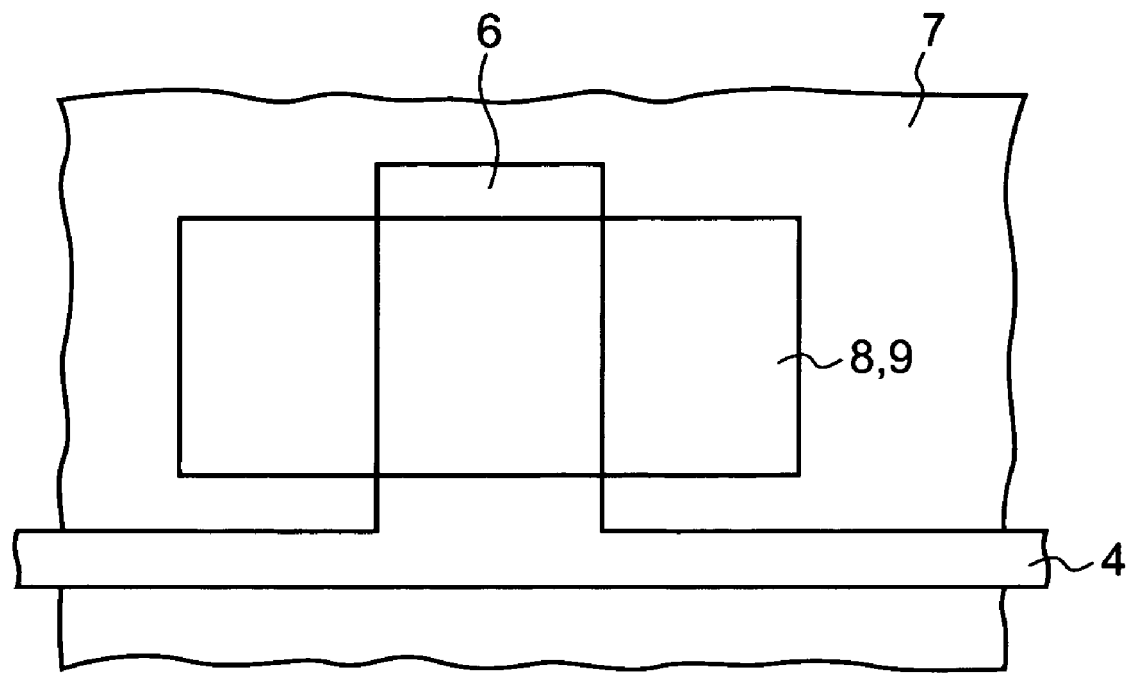
FIG. 4A is a transparent plan view illustrating a process subsequent to FIGS. 3A and 3B.
Figure 4B:
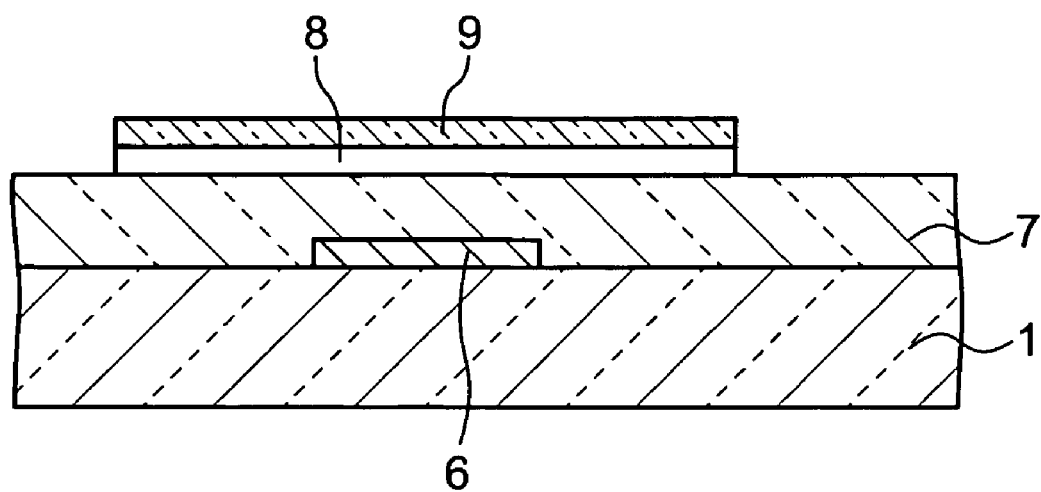
FIG. 4B is a cross sectional view cut along a substantially central line in a channel width direction of the thin film transistor illustrated in FIG. 4A.

Sequentially, when the semiconductor thin film forming layer 8a is etched using the protection film 9 as a mask, the semiconductor thin film forming layer 8a is formed under the protection film 9 as illustrated in FIGS. 4A and 4B. In this case, an alkali solution is used as an etchant for the intrinsic zinc oxide semiconductor thin film forming layer 8a. For example, a solution of sodium hydroxide (NaOH) of below 30 wt %, preferably 2 to 10 wt % is used. Etchant temperature is 5 to 40° C., preferably room temperature (22 to 23° C.).

Then, when a 5 wt % sodium hydroxide (NaOH) solution was used as an etchant (temperature was room temperature (22 to 23° C.)), an etching speed was about 80 nm/min. In consideration of controllability of machining, if the etching speed is too high, it is difficult to control etching end due to variations in a film thickness and density. If the etching speed is too low, productivity is, of course, reduced. Accordingly, it is generally believed that the etching speed is preferably about 100 to 200 nm/min. It can be said that the 5 wt % sodium hydroxide (NaOH) solution at the etching speed of about 80 nm/min is in a passably satisfactory range. However, concentration of sodium may be increased to improve productivity efficiency. Moreover, in the case where a phosphoric acid solution whose etching speed is high is used as an etchant, concentration must be extremely low, about 0.05%. However, the use of etchant with a low concentration increases the speed of deterioration due to etching, resulting in difficulty in control. Namely, when the concentration is too low, the concentration of phosphoric acid solution immediately reaches below the appropriate concentration by resist material dissolved by etching and a foreign substance contained in the resist material, so that appropriate etching cannot be performed. In contrast to this, the use of the sodium hydroxide solution is effective in terms of the point that the solution of below about 30 wt %, preferably 2 to 10 wt % can be used and the speed of deterioration due to etching is low. Additionally, as is obvious from FIG. 4A, when the semiconductor thin film forming layer 8a is etched to form the semiconductor thin film 8, side etching occurs on a peripheral end surface of the semiconductor thin film 8. In general, when side etching occurs in an active layer of the thin film transistor, an adverse influence is exerted upon the transistor characteristic. However, the thin film transistor of the present invention is structured such that no adverse influence is exerted upon the transistor characteristic even if side etching occurs on the peripheral end surface of the semiconductor thin film 8. The reason will be described later.

Figure 5A:
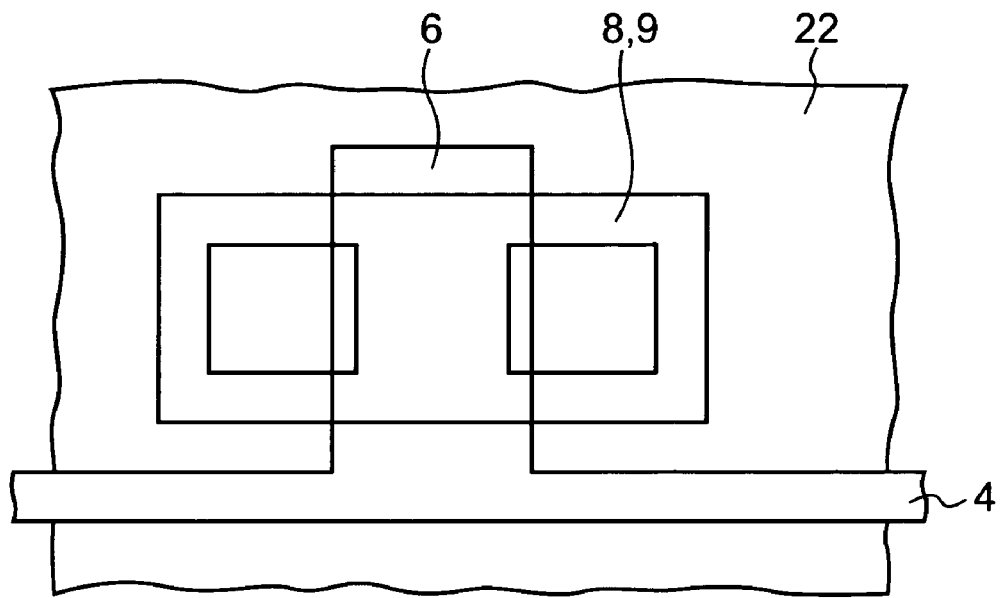
FIG. 5A is a transparent plan view illustrating a process subsequent to FIGS. 4A and 4B.
Figure 5B:
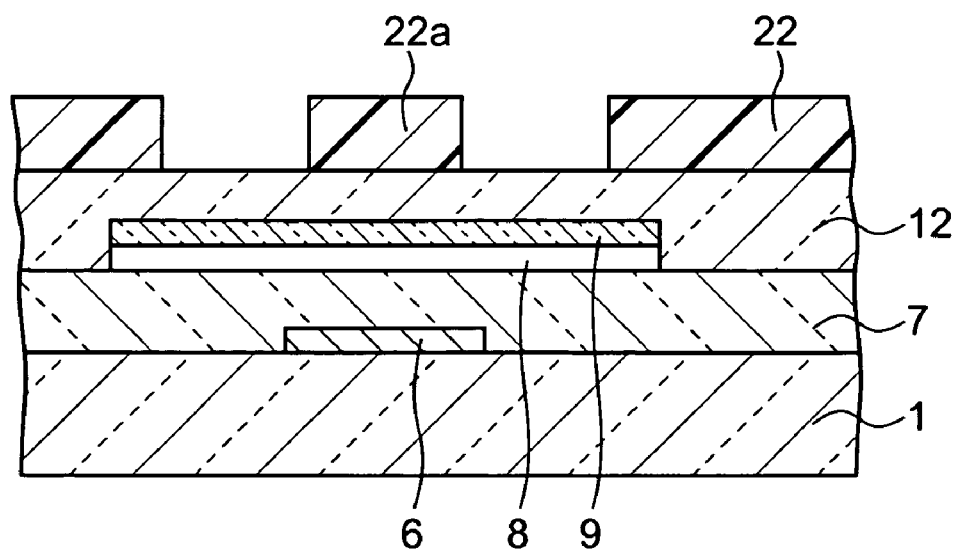
FIG. 5B is a cross sectional view cut along a substantially central line in a channel width direction of the thin film transistor illustrated in FIG. 5A.

Next, as illustrated in FIGS. 5A and 5B, the upper insulating film 12 made of silicon nitride is film-formed on the upper surface of the gate insulating film 7 including the protection film 9 by plasma CVD. Sequentially, on the upper surface of the upper insulating film 12, a resist pattern 22 for forming contact holes is formed by photolithography.

Figure 6A:
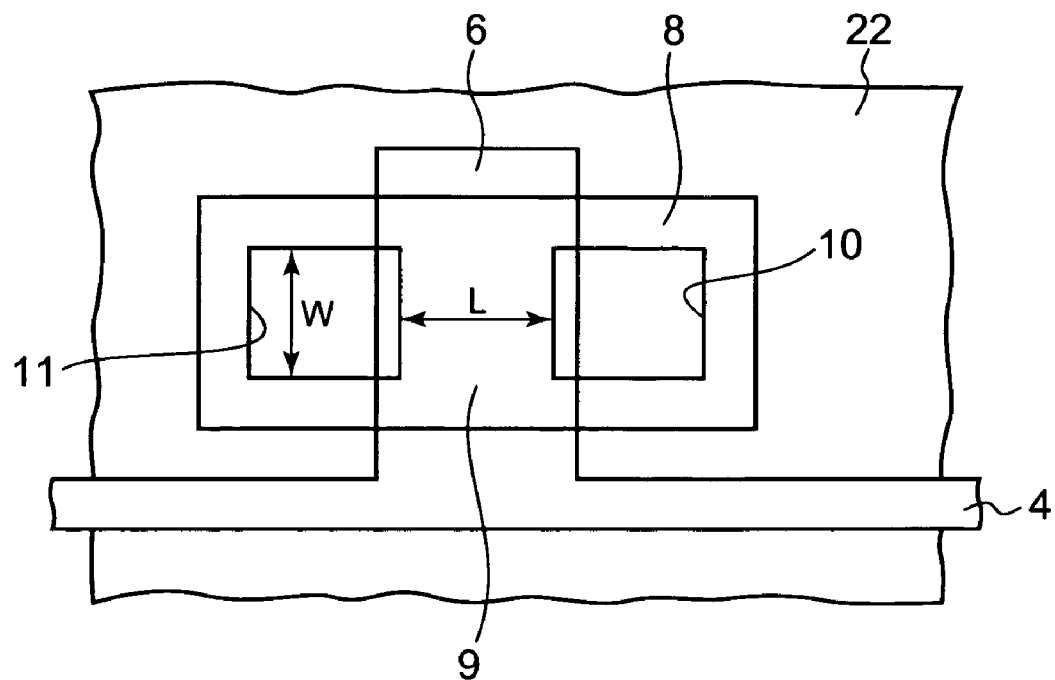
FIG. 6A is a transparent plan view illustrating a process subsequent to FIGS. 5A and 5B.
Figure 6B:
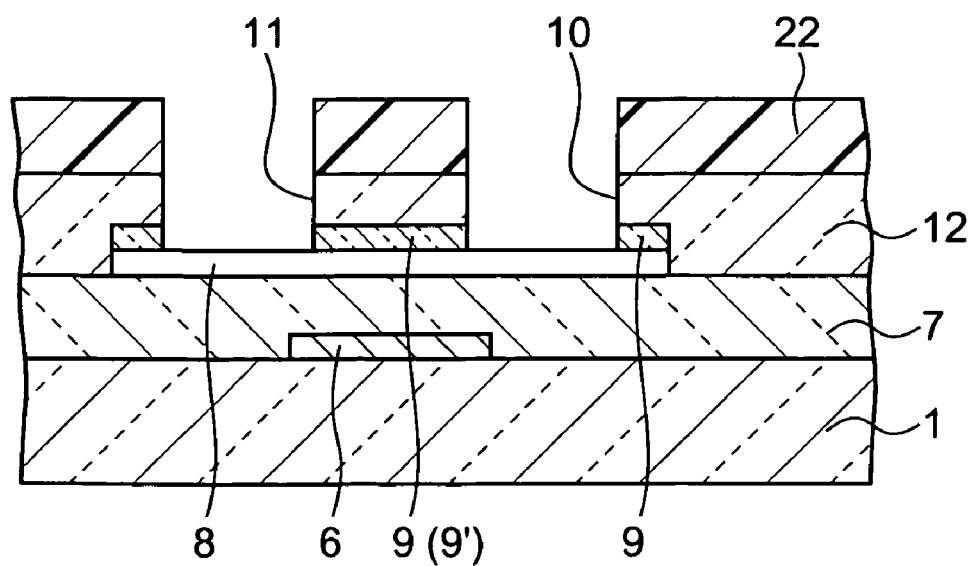
FIG. 6B is a cross sectional view cut along a substantially central line in a channel width direction of the thin film transistor illustrated in FIG. 6A.

Next, when the upper insulating film 12 and the protection film 9 are continuously etched using the resist pattern 22 as a mask, two contact holes 10 and 11 are continuously formed on predetermined portions of the upper insulating film 12 and the protection film 9 as illustrated in FIGS. 6A and 6B. In this case, since the contact holes 10 and 11 are continuously formed on the upper insulating film 12 and the protection film 9, the material of the upper insulating film 12 is preferably the same as that of the protection film 9, and the silicon nitride is used in the present embodiment.

Moreover, in this case, the surface of the semiconductor thin film 8 made of intrinsic zinc oxide in the contact holes 10 and 11 is exposed. Accordingly, as an etching method for forming the contact holes 10 and 11 on the upper insulating film 12 and protection film 9 both made of silicon nitride, the reactive plasma etching (dry etching) using sulfur hexafluoride (SF6) is favorable, similar to the above.

Next, the resist pattern 22 is stripped using a resist stripper. As a resist stripper in this case, one that exhibits neither acidity nor alkalinity (no electrolyte is contained), for example, a single organic solvent (e.g., dimethylsulfoxide solvent (DMSO)) is preferably used so as not to penetrate into the upper surface of the semiconductor thin film 8 exposed through the contact holes 10 and 11. Additionally, it was recognized by the inventors of the present invention that resist stripping was satisfactorily performed even if the single organic solvent (e.g., dimethylsulfoxide solvent (DMSO)) was used.

Herein, the space between the contact holes 10 and 11 corresponds to the channel length L, and the size of each of the contact holes 11 and 12 in the direction orthogonal to the above space between corresponds to the channel width W. In this case, the peripheral portion of the upper surface of the semiconductor thin film 8 is covered with the protection film 9. Accordingly, in the process illustrated in FIGS. 4A and 4B, no adverse influence is exerted upon the channel length L and the channel width W even if side etching occurs on the peripheral end surface of the semiconductor thin film 8.

Figure 7A:
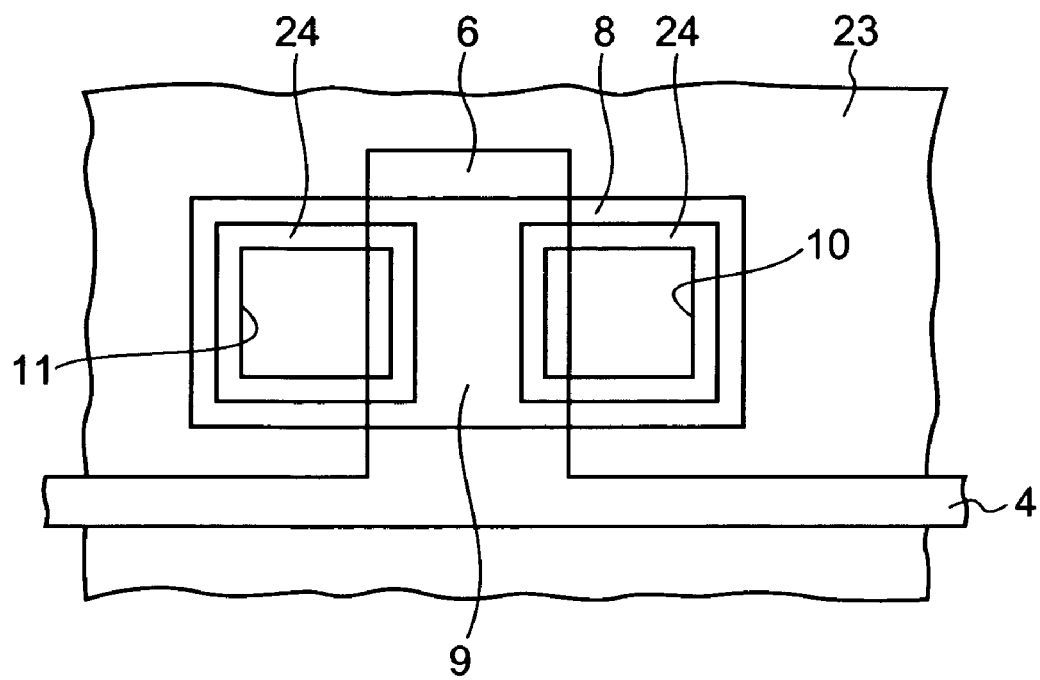
FIG. 7A is a transparent plan view illustrating a process subsequent to FIGS. 6A and 6B.
Figure 7B:
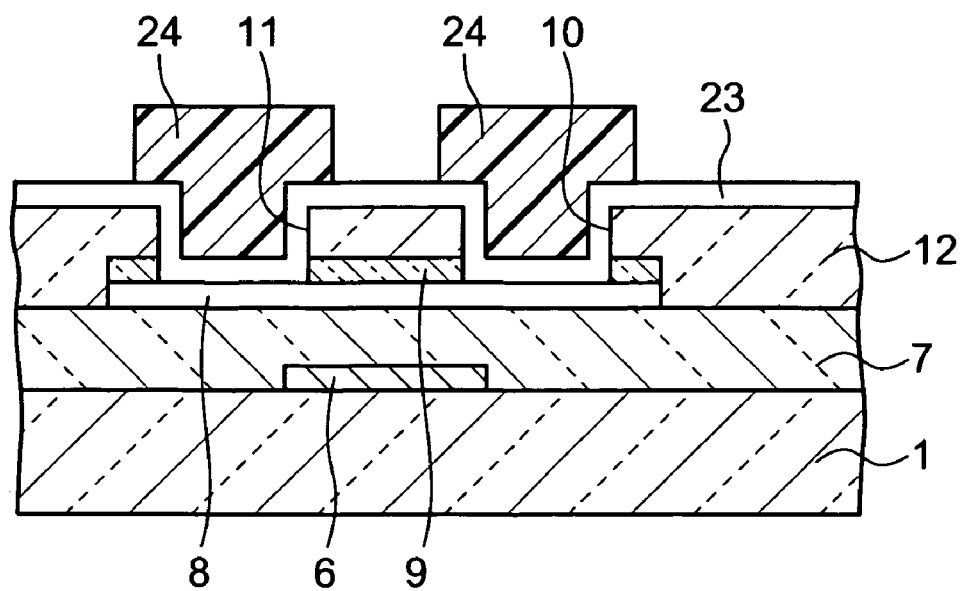
FIG. 7B is a cross sectional view cut along a substantially central line in a channel width direction of the thin film transistor illustrated in FIG. 7A.

Next, as illustrated in FIGS. 7A and 7B, on the upper surface of the upper insulating film 12 including the upper surface of the semiconductor thin film 8 exposed through the contact holes 10 and 11, an ohmic contact layer forming layer 23 of an n-type zinc oxide is film-formed by CVD. Sequentially, on an upper surface of the ohmic contact layer forming layer 23, an ohmic contact layer forming resist pattern 24 is formed by photolithography.

Figure 8A:
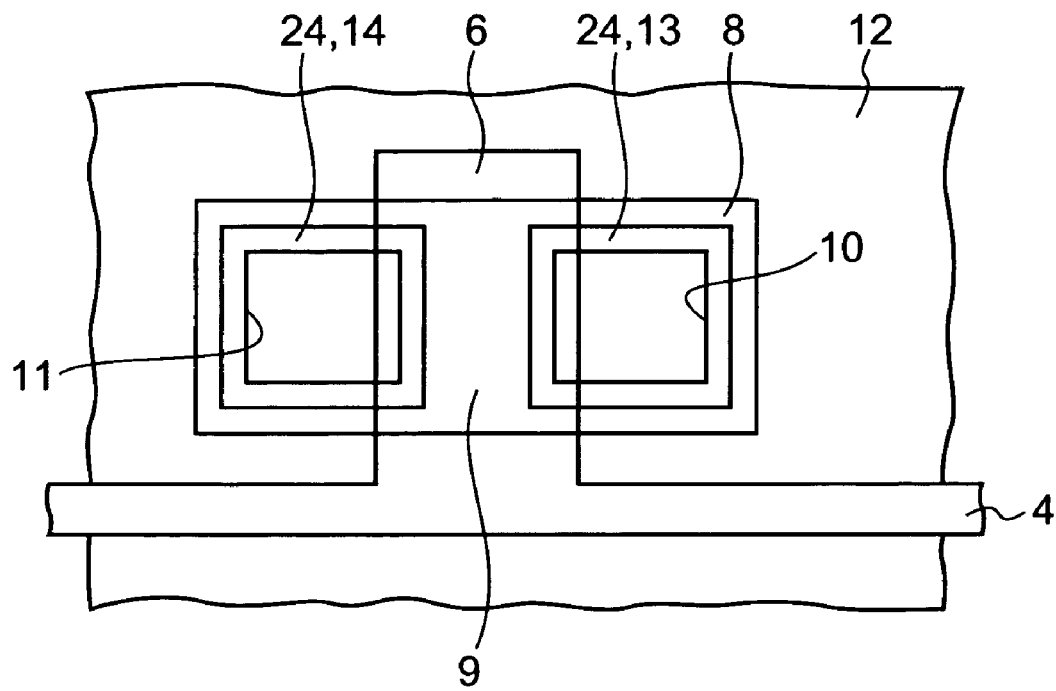
FIG. 8A is a transparent plan view illustrating a process subsequent to FIGS. 7A and 7B.
Figure 8B:
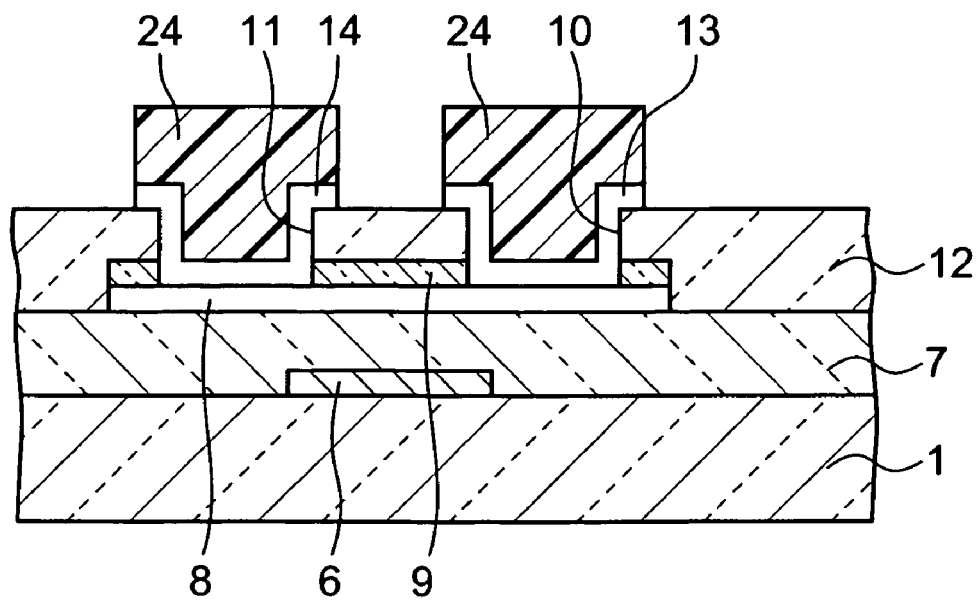
FIG. 8B is a cross sectional view cut along a substantially central line in a channel width direction of the thin film transistor illustrated in FIG. 8A.

Next, when the ohmic contact layer forming layer 23 is etched using the resist pattern 24 as a mask, ohmic contact layers 13 and 14 are formed under the resist pattern 24 as illustrated in FIGS. 8A and 8B. In this case, since the ohmic contact layer forming layer 23 is formed of the n-type zinc oxide, the use of sodium hydroxide solution as an etchant allows controllability of machining to be improved.

Next, the ohmic contact layer forming resist pattern 24 is stripped using a resist stripper. In this case, the contact holes 10 and 11 are completely covered with the ohmic contact layers 13 and 14. Accordingly, after the ohmic contact layer forming layer 23 is film-formed, the semiconductor thin film 8 is completely protected without being exposed to the resist stripper. This makes it possible to improve machining accuracy. Moreover, in this case, the surfaces of the ohmic contact layers 13 and 14 are exposed. Accordingly, as a resist stripper in this case, one that exhibits neither acidity nor alkalinity (no electrolyte is contained), for example, a single organic solvent (e.g., dimethylsulfoxide solvent (DMSO)) is used.

Figure 9A:
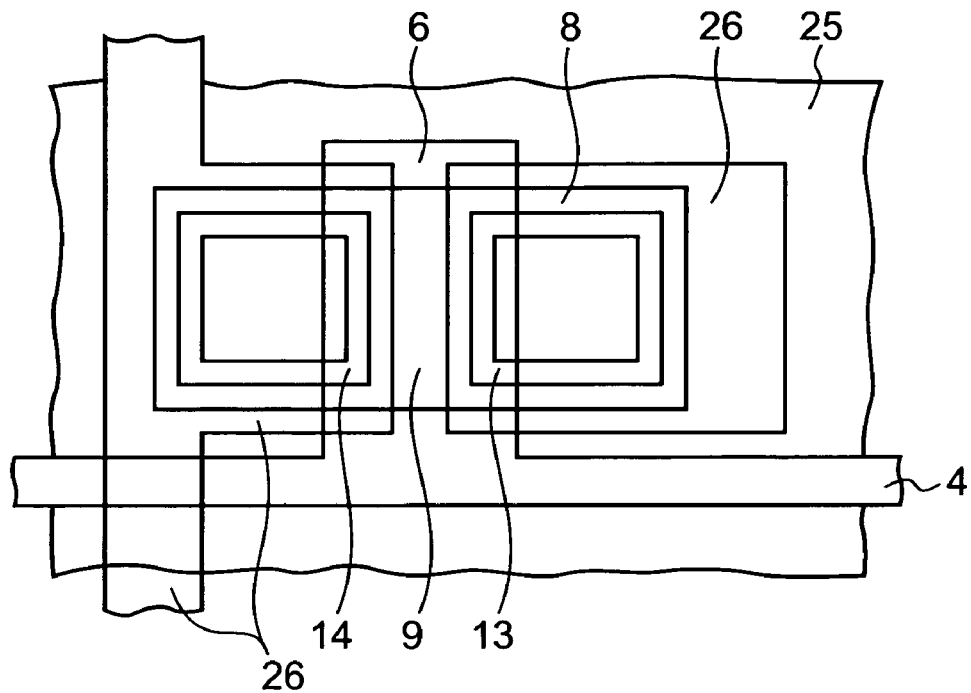
FIG. 9A is a transparent plan view illustrating a process subsequent to FIGS. 8A and 8B.
Figure 9B:
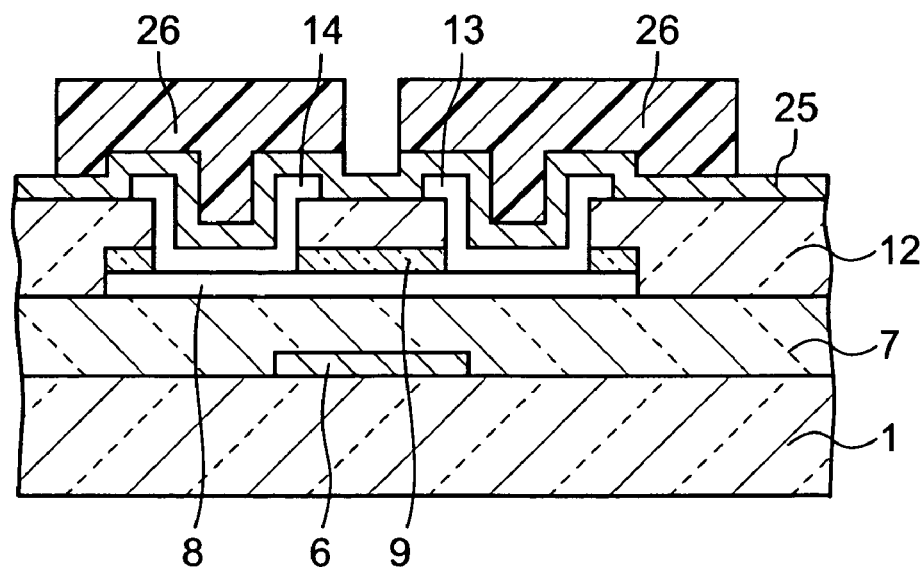
FIG. 9B is a cross sectional view cut along a substantially central line in a channel width direction of the thin film transistor illustrated in FIG. 9A.

Next, as illustrated in FIGS. 9A and 9B, on the upper surface of the upper insulating film 12 including the ohmic contact layers 13 and 14, a source and drain electrode forming layer 25, which is formed by sputtering and which is made of metal such as chromium, aluminum, ITO, etc, is film-formed. Sequentially, on an upper surface of the source and drain electrode forming layer 25, a resist pattern 26, which corresponds to the source electrode, the drain electrode, and the data line 5, is formed by photolithography.

Figure 10A:
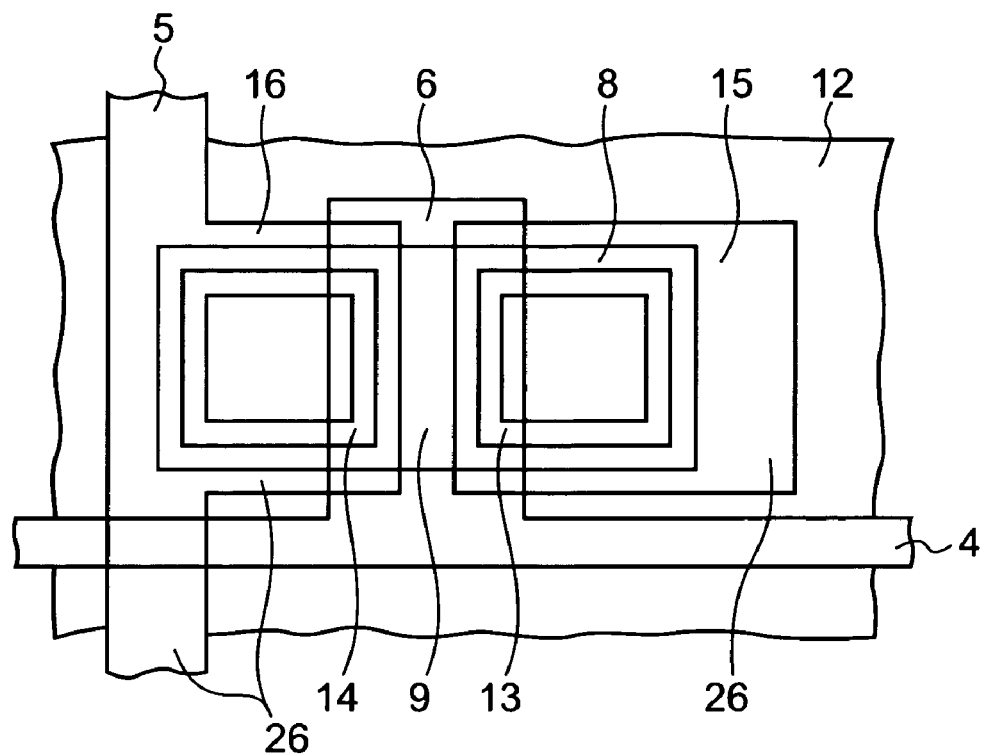
FIG. 10A is a transparent plan view illustrating a process subsequent to FIGS. 9A and 9B.
Figure 10B:
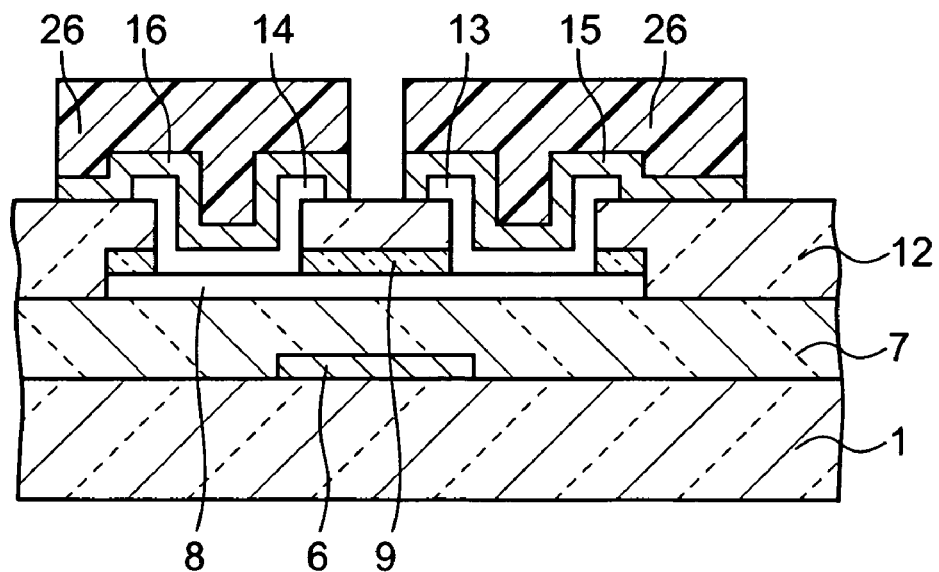
FIG. 10B is a cross sectional view cut along a substantially central line in a channel width direction of the thin film transistor illustrated in FIG. 10A.

Next, when the source and drain electrode forming layer 25 is etched using the resist pattern 26 as a mask, the source electrode 15, the drain electrode 16, and the data line 5 are formed under the resist pattern 26 as illustrated in FIGS. 10A and 10B. Sequentially, the resist pattern 26 is stripped using a resist stripper.

In this case, the ohmic contact layers 13 and 14 are completely covered with the source electrode 15 and the drain electrode 16. Accordingly, after the source and drain electrode forming layer 25 is formed, the ohmic contact layers 13 and 14 are completely protected without being exposed to the etchant for etching the source and drain electrode forming layer 25 and the resist stripper. This makes it possible to improve machining accuracy.

Next, as illustrated in FIGS. 1A and 1B, on the upper surface of the upper insulating film 12 including the source electrode 15, the drain electrode 16 and the data line 5, the overcoat film 17 made of silicon nitride is formed by plasma CVD. Sequentially, on a predetermined portion of the overcoat film 17, the contact hole 18 is formed by photolithography. After that, the pixel electrode 2 is formed on a predetermined portion of the overcoat film 17 such a manner that the pixel electrode forming layer, which is formed by sputtering and which is made of transparent conductive material such as ITO, etc., is patterned by photolithography to connect the pixel electrode 2 to the source electrode 15 through the contact hole 18.

As mentioned above, according to the aforementioned manufacturing method, the protection film 9 is formed on the entire upper surface of the semiconductor thin film 8 and two contact holes 10 and 11, which determine the channel length L and the channel width W based on the space between the contact holes 10 and 11 and the size in the direction orthogonal to the space, are formed on the protection film 9. This makes it possible to improve machining accuracy without causing a change in the channel length L and the channel width W, which are determined by two contact holes 10 and 11 formed on the protection film 9, even if side etching slightly occurs on the semiconductor thin film 8.

Figure 11A:
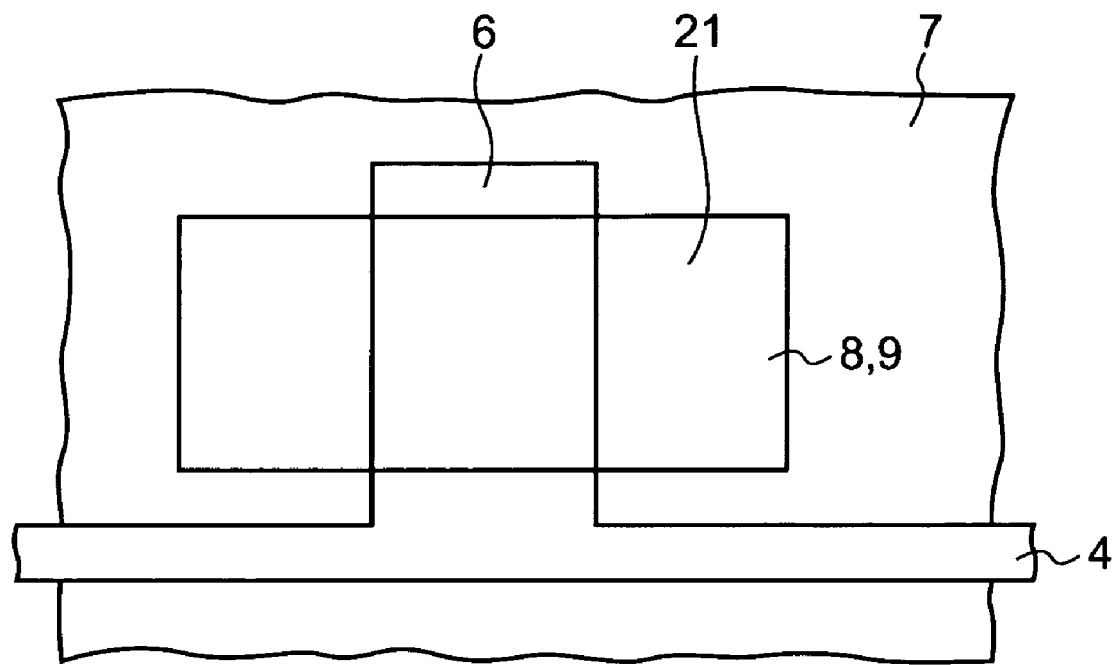
FIG. 11A is a transparent plan view illustrating a predetermined process of another manufacturing method of the thin film transistor part illustrated in FIG. 1A and 1B.
Figure 11B:
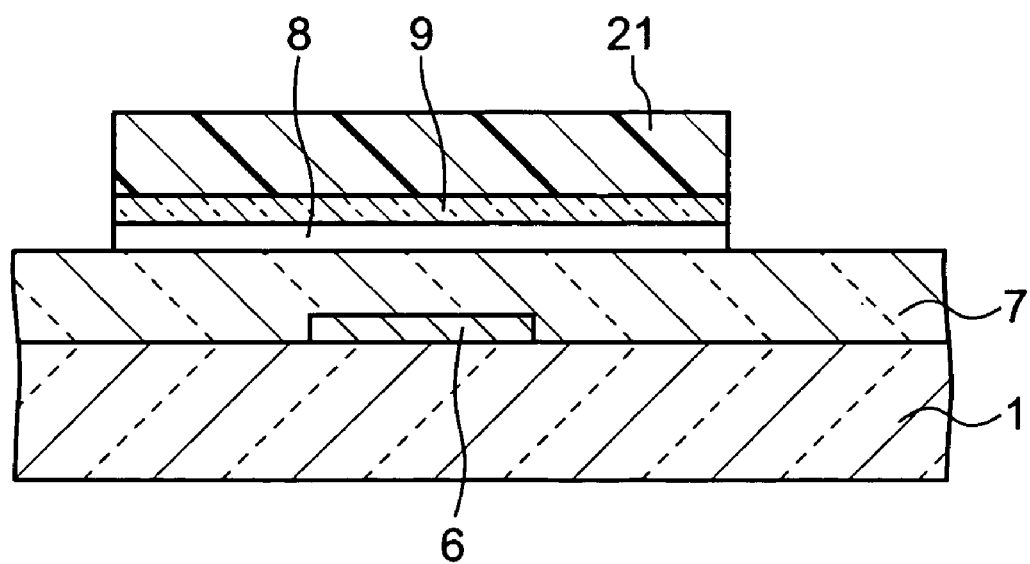
FIG. 11B is a cross sectional view cut along a substantially central line in a channel width direction of the thin film transistor illustrated in FIG. 11A.

Additionally, in the state as illustrated in FIGS. 2A and 2B, the protection film forming layer 9a and the semiconductor thin film forming layer 8a may be continuously etched using the resist pattern 21 as a mask to form the protection film 9 and the semiconductor thin film 8 under the resist pattern 21 as illustrated in FIGS. 11A and 11B. After that, the resist pattern 21 may be stripped using a resist stripper.

Moreover, in the aforementioned embodiment, as illustrated in FIGS. 6A and 6B, the protection film 9 and the upper insulating film 12 are layered on the channel region of the semiconductor thin film 8. However, the protection film 9 may be formed on only the upper surface peripheral portion of the semiconductor thin film 8 and only the upper insulating film 12 may be formed on the channel region of the semiconductor thin film 8.

Regarding the manufacturing method in this case, in the state illustrated in FIGS. 11A and 11B, the resist pattern 21 is shaped to cover only the peripheral portion of the protection film 8. Then, etching is performed using the resist pattern 21 as a mask to form the protection film 9 on only the peripheral portion of the semiconductor thin film 8. Accordingly, in the state illustrated in FIGS. 6A and 6B, the protection film 9 is formed on only the peripheral portion of the semiconductor thin film 8, and no central portion 9' is formed on the channel region. After that, the upper insulating film 12 is formed, and the resist pattern 22 is formed as illustrated in FIGS. 6A and 6B. Then, the upper insulating film 12 is etched. As a result, on the channel region of the semiconductor thin film 8, no central portion 9' of the protection film 9 is formed and only the upper insulating film 12 is formed.

Second Embodiment

Figure 12A:
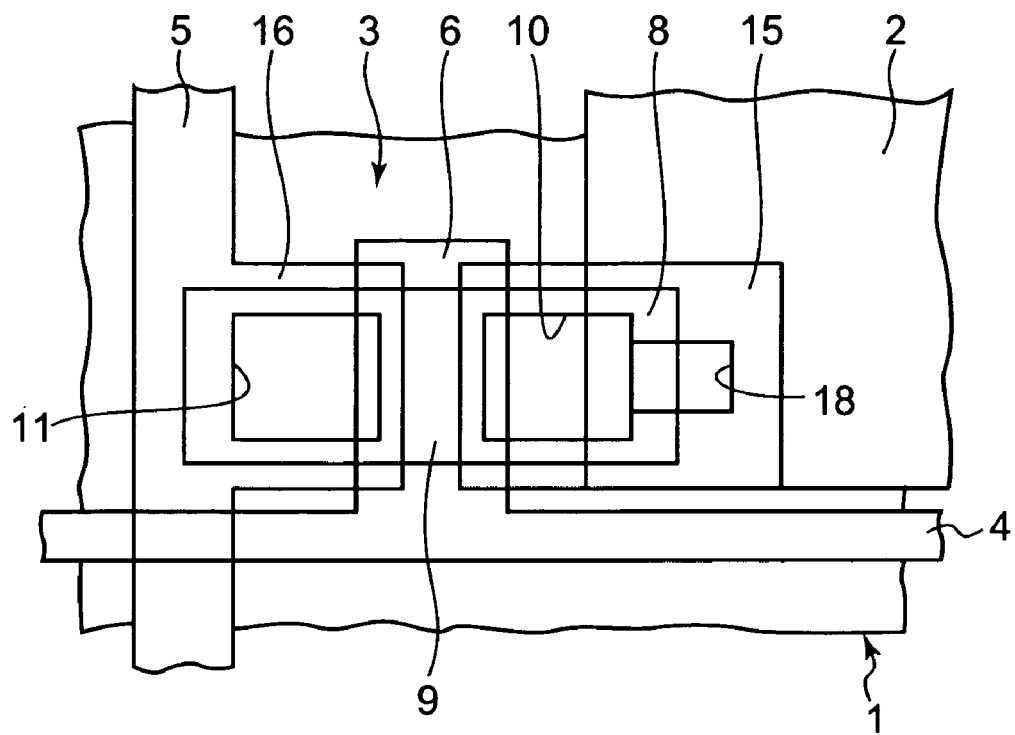
FIG. 12A is a transparent plan view illustrating a principal part of a liquid crystal display device having a thin film transistor according to a second embodiment of the present invention.
Figure 12B:
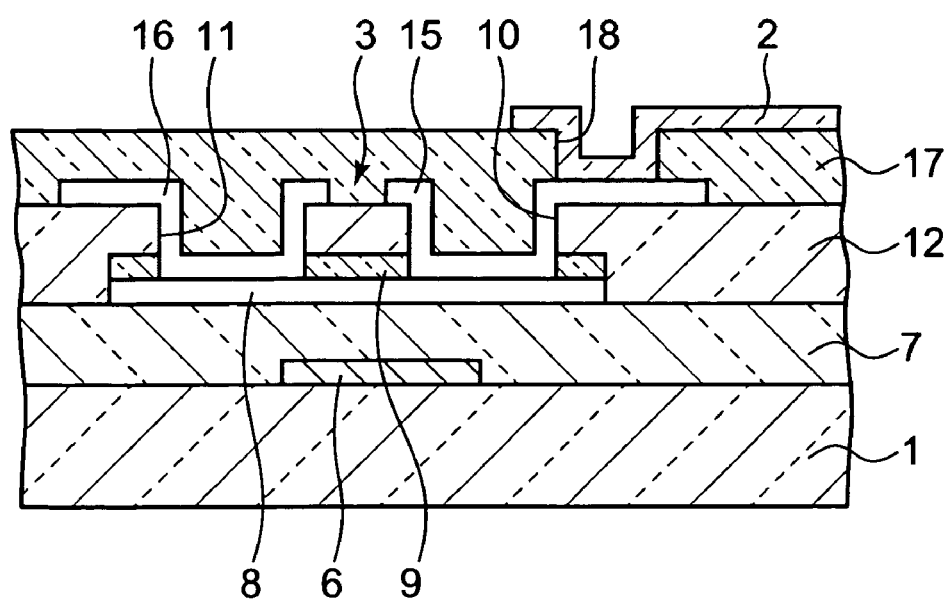
FIG. 12B is a cross sectional view cut along a substantially central line in a channel width direction of the thin film transistor illustrated in FIG. 12A.

FIG. 12A is a transparent plan view illustrating a principal part of a liquid crystal display device having a thin film transistor according to a second embodiment of the present invention and FIG. 12B is a cross sectional view cut along a substantially central line in a channel width direction of the thin film transistor illustrated in FIG. 12A. The liquid crystal display device of the present embodiment is different from that illustrated in FIGS. 1A and 1B in the point that no ohmic contact layers 13 and 14 are provided and the source electrode 15 and the drain electrode 16 are directly connected to the semiconductor thin film 8 through the contact holes 10 and 11.

Thus, in the case of the semiconductor thin film 8 being made of intrinsic zinc oxide, it was recognized that the thin film transistor 3 was normally operated even if the source electrode 15 and the drain electrode 16, which were formed of aluminum, ITO, etc., were directly connected to the semiconductor thin film 8 through the contact holes 10 and 11.

However, in order to obtain more satisfactory contact, the semiconductor thin film 8 exposed through the contact holes 10 and 11 may be subjected to resistance reduction. For example, after the process illustrated in FIGS. 6A and 6B, ion doping or chemicals treatment is performed using the upper insulting film 12 and the protection film 9 as a mask. Or, the source and drain forming layer for forming the source electrode 15 and the drain electrode 16 is next film-formed, and thereafter thermal diffusion is performed using the upper insulating film 12 and the protection film 9 as a mask. This allows semiconductor thin film 8 exposed through the contact holes 10 and 11 to be subjected to resistance reduction.

Accordingly, in the second embodiment, the process for forming the ohmic contact layers 13 and 14 becomes unnecessary. Moreover, even when the semiconductor thin film 8 exposed through the contact holes 10 and 11 is subjected to resistance reduction, resistance reduction can be performed using the upper insulating film 12 and the protection film 9 as a mask to make it possible to reduce the number of processes as a whole.

Furthermore, in the second embodiment, since the ohmic contact layers 13 and 14 (FIGS. 1A and 1B) larger than the contact holes 10 and 11 are not provided, the contact holes 10 and 11 may be covered with the source electrode 15 and the drain electrode 16. As a result, as compared with the case illustrated in FIGS. 1A and 1B, the source electrode 15 and the drain electrode 16 can be reduced to some extent. Also, the space between the source electrode 15 and the drain electrode 16 can be reduced to some extent and the thin film transistor 3 can be miniaturized to some extent, and the size of the pixel electrode 2 can be increased to some extent.

Third Embodiment

Figure 13A:
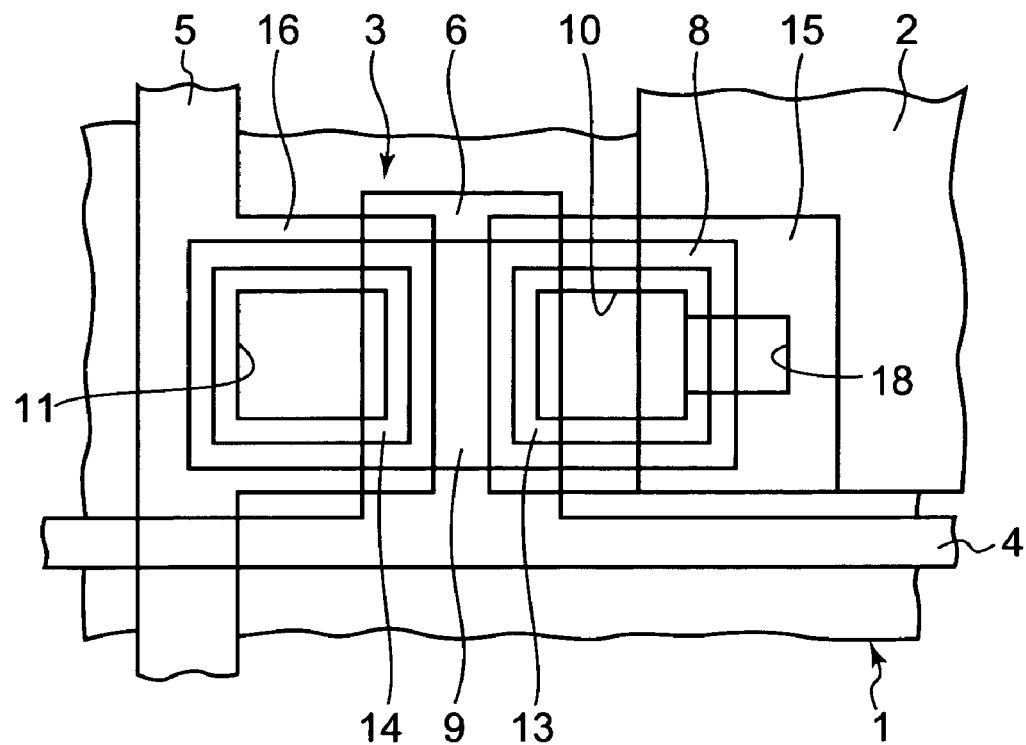
FIG. 13A is a transparent plan view illustrating a principal part of a liquid crystal display device having a thin film transistor according to a third embodiment of the present invention.
Figure 13B:
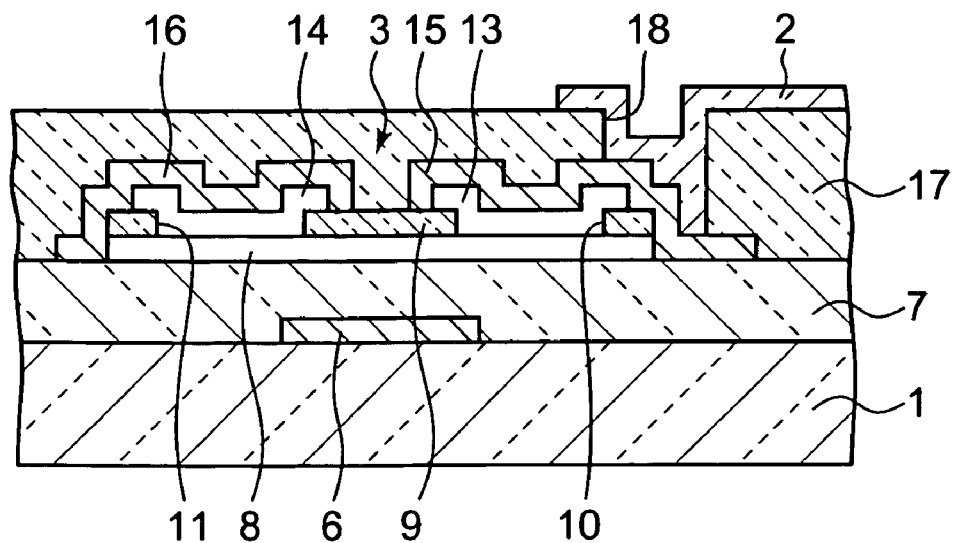
FIG. 13B is a cross sectional view cut along a substantially central line in a channel width direction of the thin film transistor illustrated in FIG. 13A.

FIG. 13A is a transparent plan view illustrating a principal part of a liquid crystal display device having a thin film transistor according to a third embodiment of the present invention, and FIG. 13B is a cross sectional view cut along a substantially central line in a channel width direction of the thin film transistor illustrated in FIG. 13A. The liquid crystal display device of the present embodiment is different from that illustrated in FIGS. 1A and 1B in the point that no upper insulating film 12 is provided. Accordingly, the process for film-forming the upper insulating film 12 can be omitted.

However, in this case, after the contact hole forming process as illustrated in FIGS. 6A and 6B, when the resist pattern (not shown), which is used in forming the contact holes 10 and 11 on the protection film 9, is stripped using a resist stripper, the peripheral end surface of the semiconductor thin film 8 is exposed to the resist stripper to cause side etching slightly on the semiconductor thin film 8. However, no adverse influence is exerted upon the channel length L and the channel width W. As a resist stripper in this case, one that exhibits neither acidity nor alkalinity (no electrolyte is contained), for example, a single organic solvent (e.g., dimethylsulfoxide solvent (DMSO)) is preferably used in order to prevent the peripheral end surface of the semiconductor thin film 8 from being penetrated by the resist stripper.

Fourth Embodiment

Figure 14A:
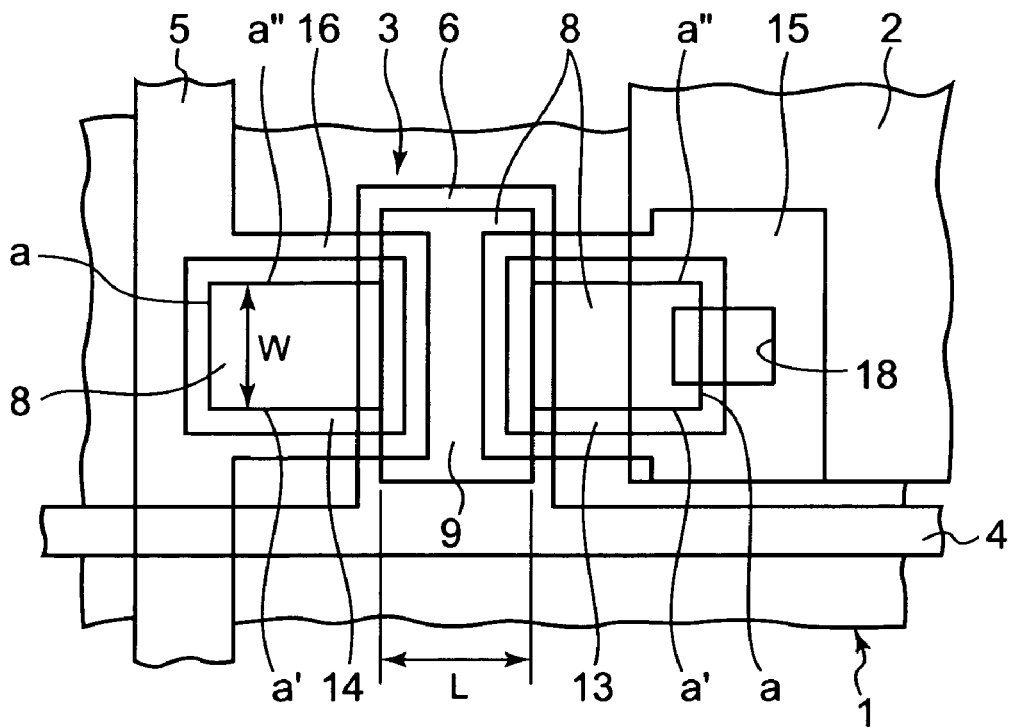
FIG. 14A is a transparent plan view illustrating a principal part of a liquid crystal display device having a thin film transistor according to a fourth embodiment of the present invention.
Figure 14B:
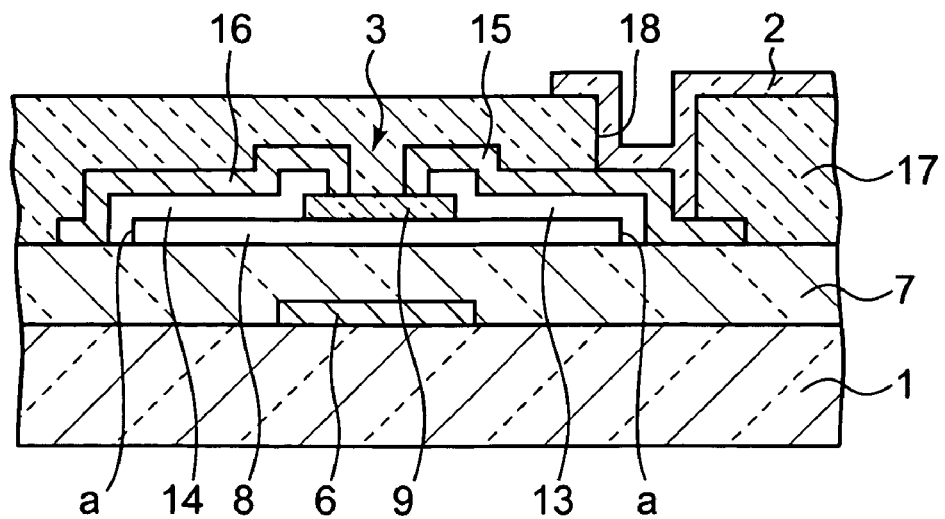
FIG. 14B is a cross sectional view cut along a substantially central line in a channel width direction of the thin film transistor illustrated in FIG. 14A.

FIG. 14A is a transparent plan view illustrating a principal part of a liquid crystal display device having a thin film transistor according to a fourth embodiment of the present invention, and FIG. 14B is a cross sectional view cut along a substantially central line in a channel width direction of the thin film transistor illustrated in FIG. 14A. The liquid crystal display device of the present embodiment is different from that of the first embodiment illustrated in FIGS. 1A and 1B in the following point. Namely, no upper insulating film 12 is provided, and the protection film 9 with no contact hole is formed on the upper surface central portion of the semiconductor thin film 8 which is substantially cross-shaped on a plane (see FIG. 18A). Then, an end surface a in the channel direction of the semiconductor thin film 8 and end surfaces a' and a" in the direction orthogonal to the end surface a are covered with the ohmic contact layers 13 and 14.

Namely, the semiconductor thin film 8 is formed on the upper surface of the gate insulating film 7. The width (channel width direction) of the semiconductor thin film 8 in the channel region is larger than the width in the source region and the width in the drain region. For example, the semiconductor thin film 8 is substantially cross-shaped on a plane. The protection film 9 is formed on the upper surface central portion of the semiconductor thin film 8 on the gate electrode 6. The ohmic contact layers 13 and 14 are formed on both sides of the upper surface of the protection film 9 and on the upper surface of the source and drain region of the semiconductor thin film 8 on the both sides of the protection film 9.

In this case, one ohmic contact layer 13 is formed to cover three end surfaces, that is, the end surface a in the channel direction at the right portion of the semiconductor thin film 8 in FIG. 14A and the end surfaces a' and a" in the direction orthogonal to the end surface a. The other ohmic contact layer 14 is formed to cover three end surfaces, that is, the end surface a in the channel direction at the left portion of the semiconductor thin film 8 in FIG. 14A and the end surfaces a' and a" in the direction orthogonal to the end surface a. Accordingly, the end surfaces of the upper and lower portions of the central portion of the semiconductor thin film 8 formed under the protection film 9 in FIG. 14A are exposed without being covered with ohmic contact layers 13 and 14.

The source electrode 15 is formed on the upper surface of one ohmic contact layer 13 and the upper surface of the gate insulating film 7 near the ohmic contact layer 13. The data line 5 including the drain electrode 16 is formed on the upper surface of the other ohmic contact layer 14 and a predetermined portion of the upper surface of the gate insulating film 7. In this case, the ohmic contact layers 13 and 14 are also completely covered with the source electrode 15 and the drain electrode 16.

Then, the size of the protection film 9 in the right and left directions in FIG. 14A corresponds to the channel length L. Moreover, the size of the semiconductor thin film 8, which is formed under the ohmic contact layers 13 and 14, in the upper and lower directions in FIG. 14A corresponds to the channel width W.

Figure 15A:
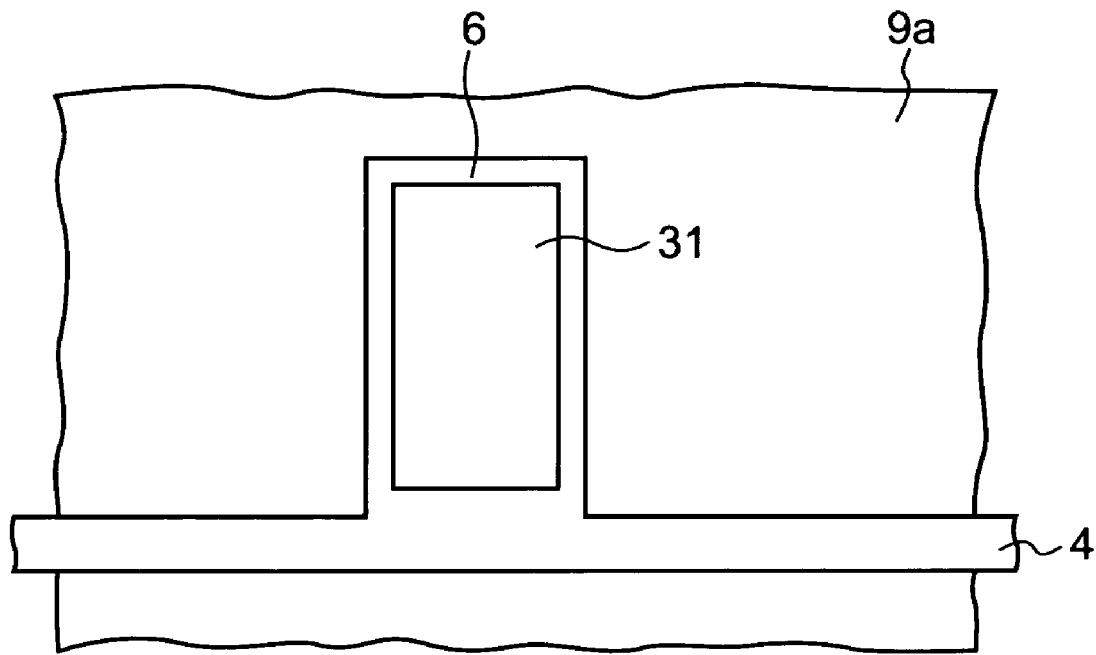
FIG. 15A is a transparent plan view illustrating an initial process in manufacturing the thin film transistor part illustrated in FIG. 14A and 14B.
Figure 15B:
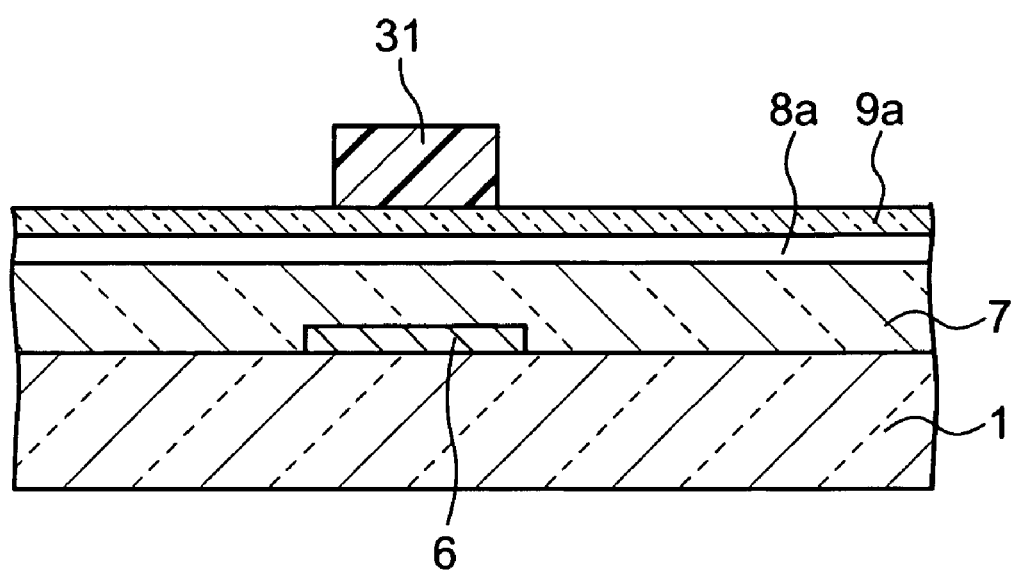
FIG. 15B is a cross sectional view cut along a substantially central line in a channel width direction of the thin film transistor illustrated in FIG. 15A.

An explanation will be next given of an example of a method for manufacturing the part of the thin film transistor 3 in the liquid crystal display device. First of all, as illustrated in FIGS. 15A and 15B, on a predetermined portion of the upper surface of the glass substrate 1, a metal layer, which is formed by sputtering and which is made of metal such as chromium, aluminum, etc, is patterned by photolithography, thereby forming the scanning line 4 including the gate electrode 6.

Next, the gate insulating film 7 made of silicon nitride, the semiconductor thin film forming layer 8a made of intrinsic zinc oxide, and the protection film forming layer 9a made of silicon nitride are continuously formed on the upper surface of the glass substrate 1 including the gate electrode 6 and the scanning line 4 by plasma CVD. After that, on the upper surface of the protection film forming layer 9a, a protection film forming resist pattern 31 is formed by photolithography.

Figure 16A:
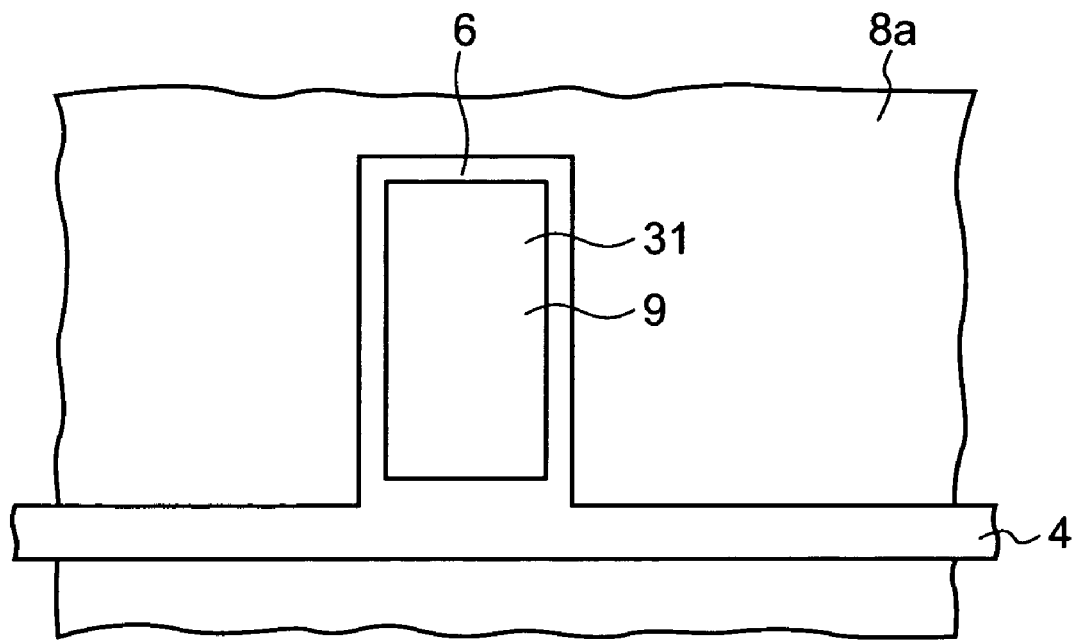
FIG. 16A is a transparent plan view illustrating a process subsequent to FIGS. 15A and 15B.
Figure 16B:
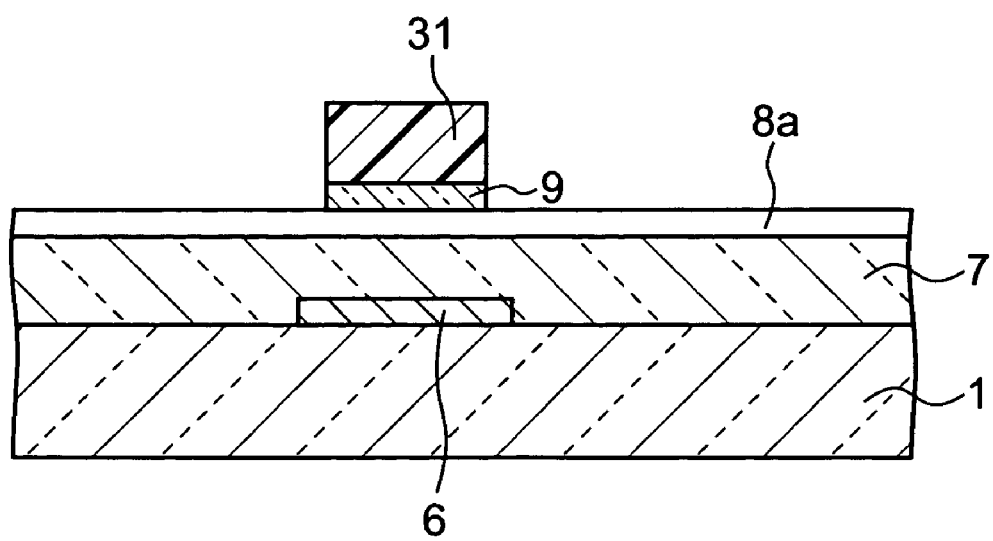
FIG. 16B is a cross sectional view cut along a substantially central line in a channel width direction of the thin film transistor illustrated in FIG. 16A.

Sequentially, when the protection film forming layer 9a is etched using the resist pattern 31 as a mask, the protection film 9 is formed under the resist pattern 31 as illustrated in FIGS. 16A and 16B. In this case, the semiconductor thin film forming layer 8a made of intrinsic zinc oxide has its surface located at the region except the portion under the resist pattern 31 exposed. Regarding the method for etching the protection film forming layer 9a made of silicon nitride, the reactive plasma etching (dry etching) using sulfur hexafluoride (SF6) is favorable, similar to the aforementioned case.

Next, the resist pattern 31 is stripped using a resist stripper. In this case, the surface of the semiconductor thin film forming layer 8a in the region except the portion under the protection film 9 is exposed. Accordingly, as a resist stripper in this case, one that exhibits neither acidity nor alkalinity (no electrolyte is contained), for example, a single organic solvent (e.g., dimethylsulfoxide solvent (DMSO)) is preferably used.

Figure 17A:
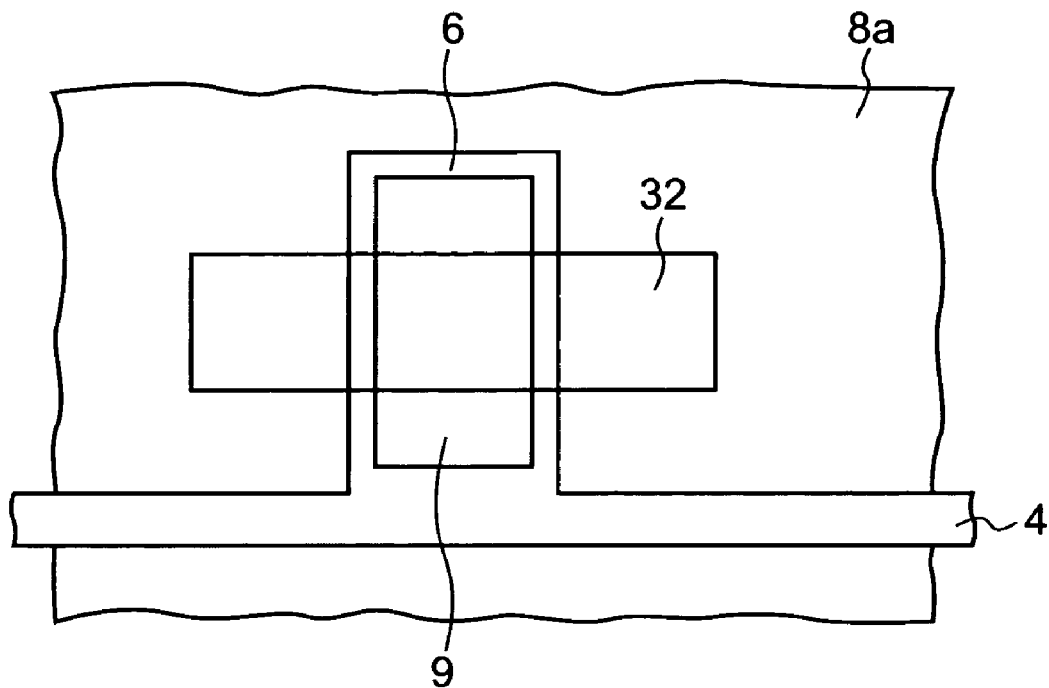
FIG. 17A is a transparent plan view illustrating a process subsequent to FIGS. 16A and 16B.
Figure 17B:
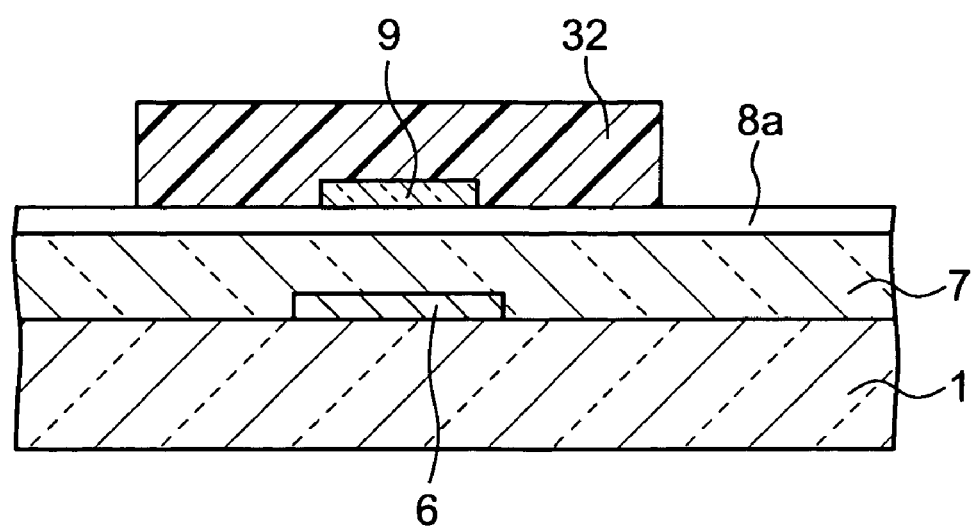
FIG. 17B is a cross sectional view cut along a substantially central line in a channel width direction of the thin film transistor illustrated in FIG. 17A.

Next, as illustrated in FIGS. 17A and 17B, a semiconductor thin film forming resist pattern 32 is formed on the upper surface of the semiconductor thin film forming layer 8a including the protection film 9 by photolithography. In this state, the semiconductor thin film forming resist pattern 32 is placed to be orthogonal to the protection film 9. Namely, both are arranged to be substantially cross-shaped on a plane as a whole.

Next, when the semiconductor thin film forming layer 8a is etched using the resist pattern 32 and the protection film 9 as a mask, the semiconductor thin film 8, which is substantially cross-shaped on a plane, is formed under the resist pattern 32 and the protection film 9. In this case, since the semiconductor thin film forming layer 8a is formed of the intrinsic zinc oxide, the use of the above sodium hydroxide solution as an etchant makes it possible to control machining satisfactorily.

Next, the resist pattern 32 is stripped using a resist stripper. In this case, the surface of the semiconductor thin film 8 in the region except under the protection film 9 is exposed. Accordingly, as a resist stripper in this case, one that exhibits neither acidity nor alkalinity (no electrolyte is contained), for example, a single organic solvent (e.g., dimethylsulfoxide solvent (DMSO)) is used.

Figure 18A:
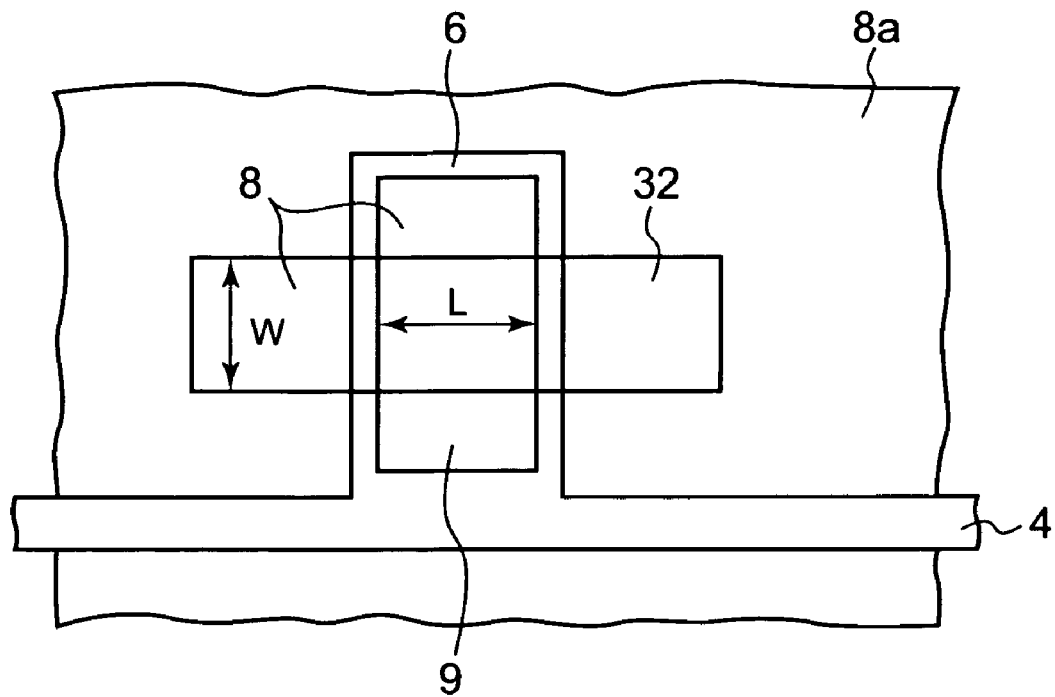
FIG. 18A is a transparent plan view illustrating a process subsequent to FIGS. 17A and 17B.
Figure 18B:
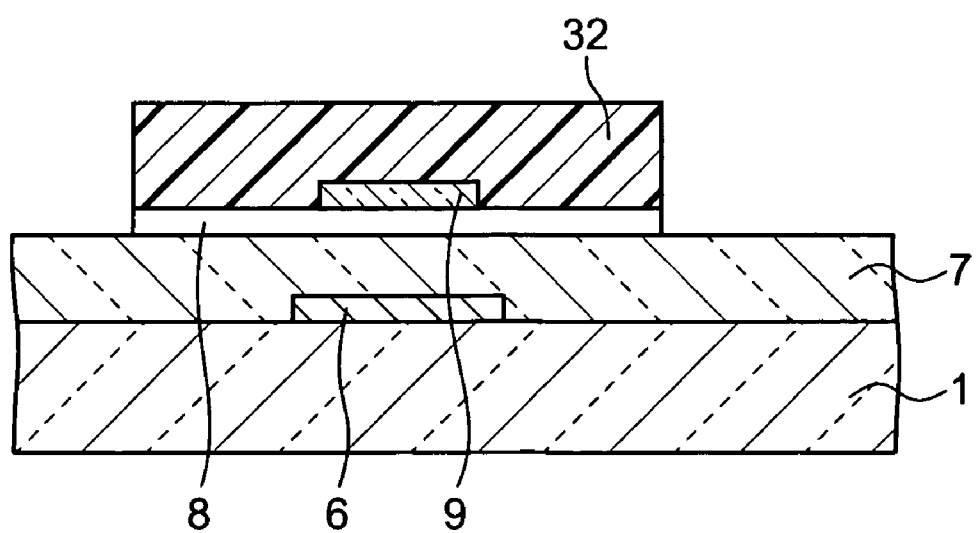
FIG. 18B is a cross sectional view cut along a substantially central line in a channel width direction of the thin film transistor illustrated in FIG. 18A.

Herein, the size of the protection film 9 in the right and left directions in FIG. 18A corresponds to the channel length L. Moreover, the size of the semiconductor thin film 8, which is formed in the region except the protection film 9, in the upper and lower directions in FIG. 18A corresponds to the channel width W.

Figure 19A:
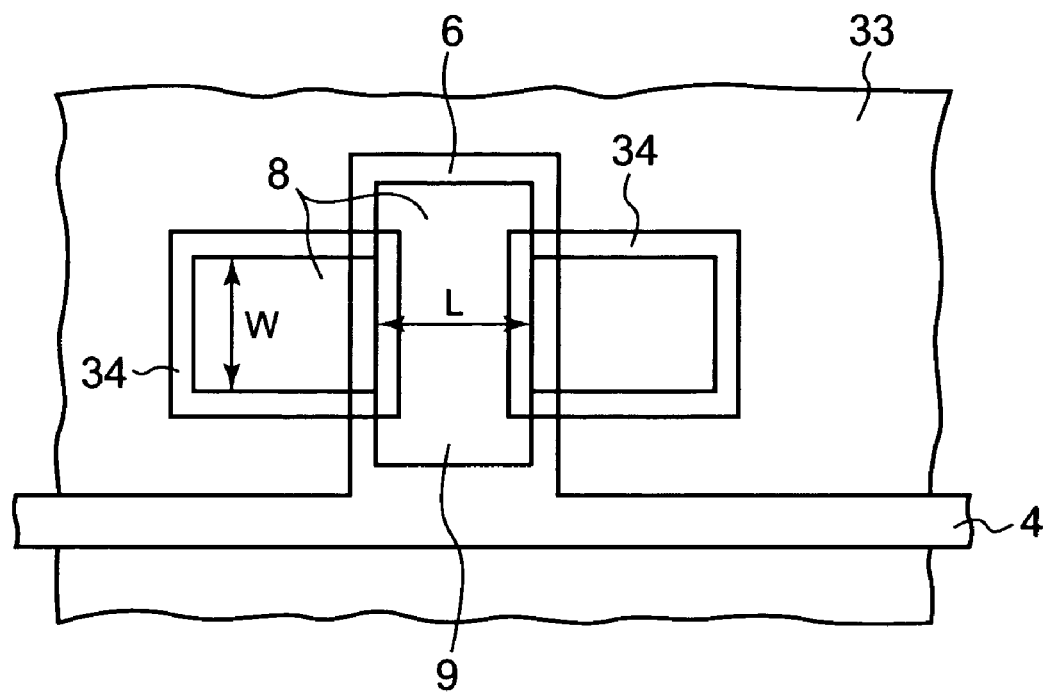
FIG. 19A is a transparent plan view illustrating a process subsequent to FIGS. 18A and 18B.
Figure 19B:
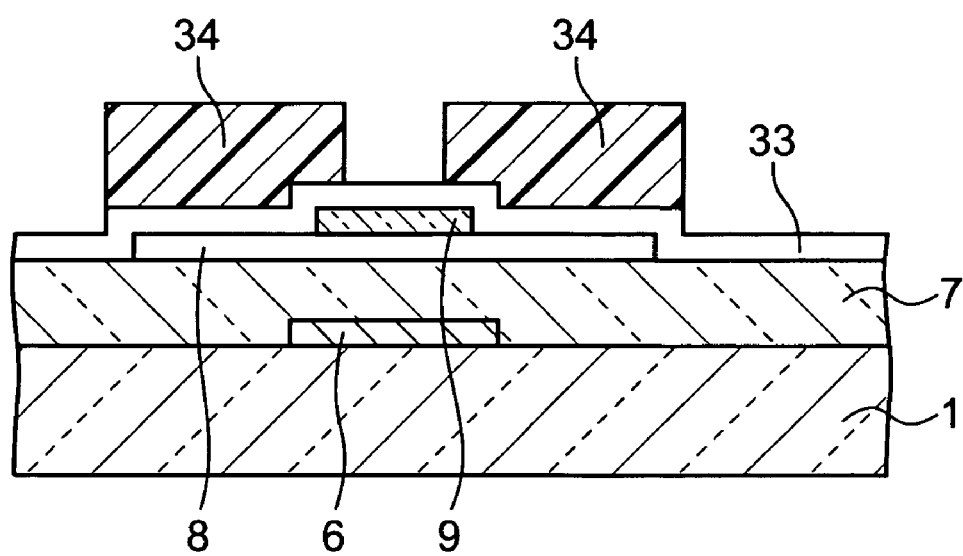
FIG. 19B is a cross sectional view cut along a substantially central line in a channel width direction of the thin film transistor illustrated in FIG. 19A.

Next, as illustrated in FIGS. 19A and 19B, on the upper surface of the gate insulating film 7 including the protection film 9 and the semiconductor thin film 8, an ohmic contact layer forming layer 33 of an n-type zinc oxide is film-formed by plasma CVD. Sequentially, on an upper surface of the ohmic contact layer forming layer 33, an ohmic contact layer forming resist pattern 34 is formed by photolithography.

Figure 20A:
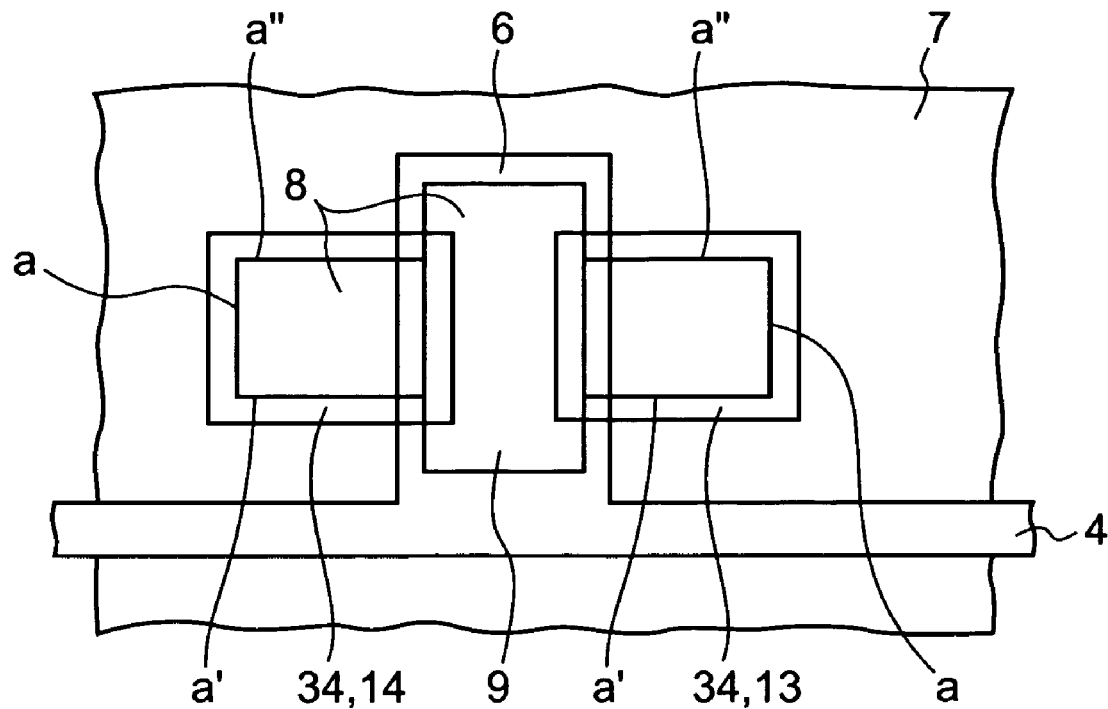
FIG. 20A is a transparent plan view illustrating a process subsequent to FIGS. 19A and 19B.
Figure 20B:
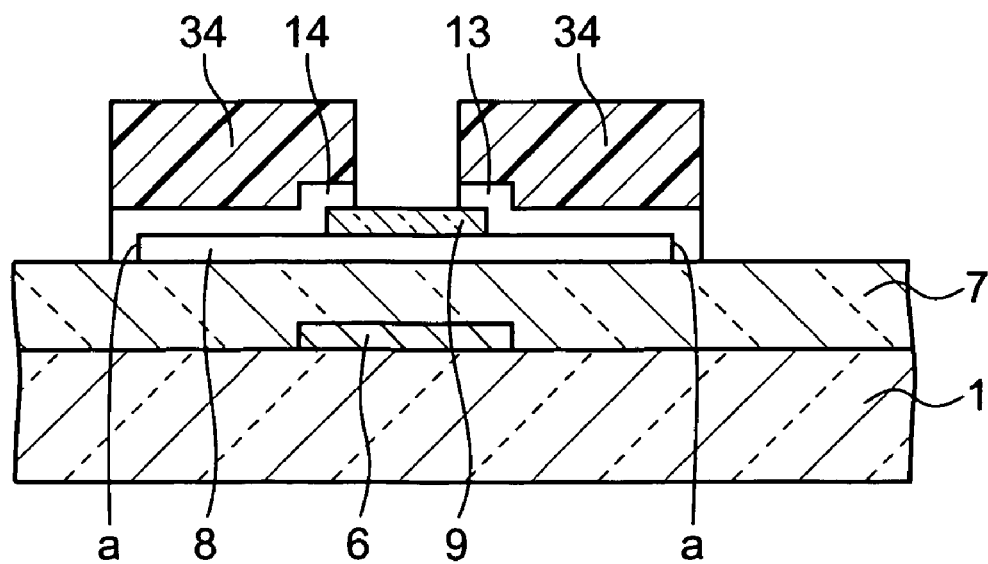
FIG. 20B is a cross sectional view cut along a substantially central line in a channel width direction of the thin film transistor illustrated in FIG. 20A.

Next, when the ohmic contact layer forming layer 33 is etched using the resist pattern 34 as a mask, the ohmic contact layers 13 and 14 are formed under the resist pattern 34 as illustrated in FIGS. 20A and 20B. In this case, one ohmic contact layer 13 is formed to cover three end surfaces a, a', a" at the right portion of the semiconductor thin film 8 in FIG. 20A. The other ohmic contact layer 14 is formed to cover three end surfaces a, a', a" at the left portion of the semiconductor thin film 8 in FIG. 20A. Furthermore, since the ohmic contact layer forming layer 33 is formed of the n-type zinc oxide, the use of the above sodium hydroxide solution as an etchant makes it possible to control machining satisfactorily.

Next, the resist pattern 34 is stripped using a resist stripper. In this case, the end surfaces of the upper and lower portions of the central portion of the semiconductor thin film 8 formed under the protection film 9 in FIG. 20A are exposed without being covered with the ohmic contact layers 13 and 14. As a result, regarding the central portion of the semiconductor thin film 8 formed under the protection film 9, when the resist pattern 34 is stripped using a resist stripper, the upper and lower end surfaces of the central portion, which are exposed without being covered with the ohmic contact layers 13 and 14 in FIG. 20A, are exposed to the resist stripper, so that side etching slightly occurs on the end surfaces.

However, the portions where side etching slightly occurs are the end surfaces of the central portion of the semiconductor thin film 8 formed under the protection film 9 illustrated in FIG. 20A. Namely, these portions are out of the region where the channel length L and the channel width W are determined. Therefore, machining accuracy can be improved without causing a change in size of the channel length L and the channel width W. Additionally, as a resist stripper, one that exhibits neither acidity nor alkalinity (no electrolyte is contained), for example, a single organic solvent (e.g., dimethylsulfoxide solvent (DMSO)) may be used.

Figure 21A:
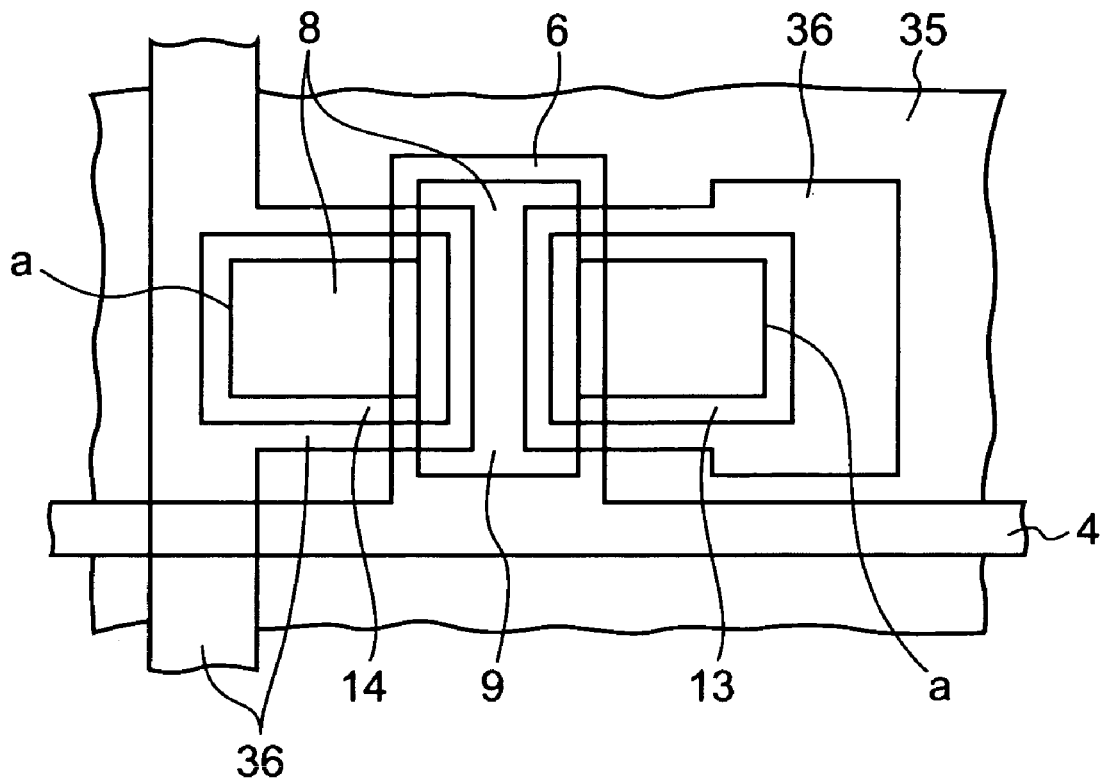
FIG. 21A is a transparent plan view illustrating a process subsequent to FIGS. 20A and 20B.
Figure 21B:
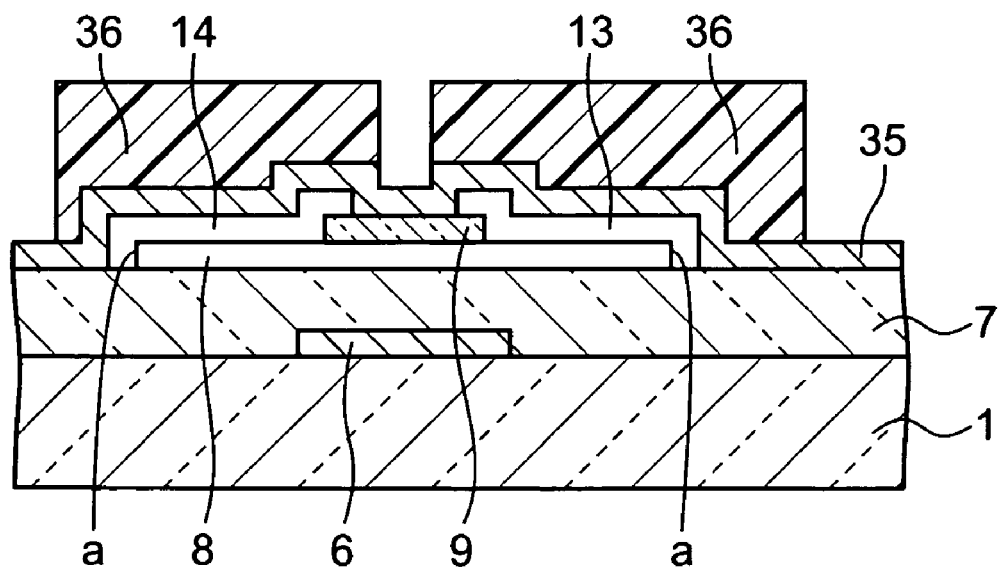
FIG. 21B is a cross sectional view cut along a substantially central line in a channel width direction of the thin film transistor illustrated in FIG. 21A.

Next, as illustrated in FIGS. 21A and 21B, on the upper surface of the gate insulating film 7 including the ohmic contact layers 13 and 14, a source and drain electrode forming layer 35, which is made of metal such as chromium, aluminum, ITO, etc., is film-formed by sputtering. Sequentially, on an upper surface of the source and drain electrode forming layer 35, a source and drain electrode forming resist pattern 36 is formed by photolithography.

Figure 22A:
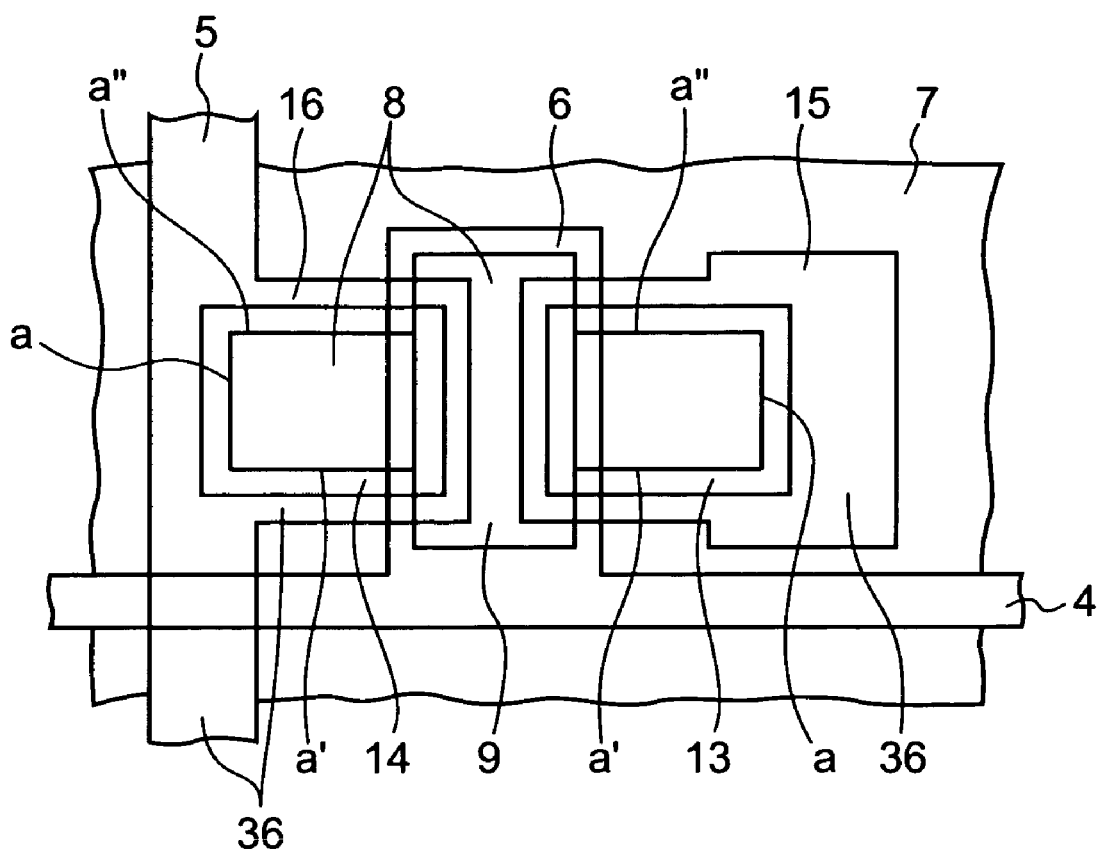
FIG. 22A is a transparent plan view illustrating a process subsequent to FIGS. 21A and 21B.
Figure 22B:
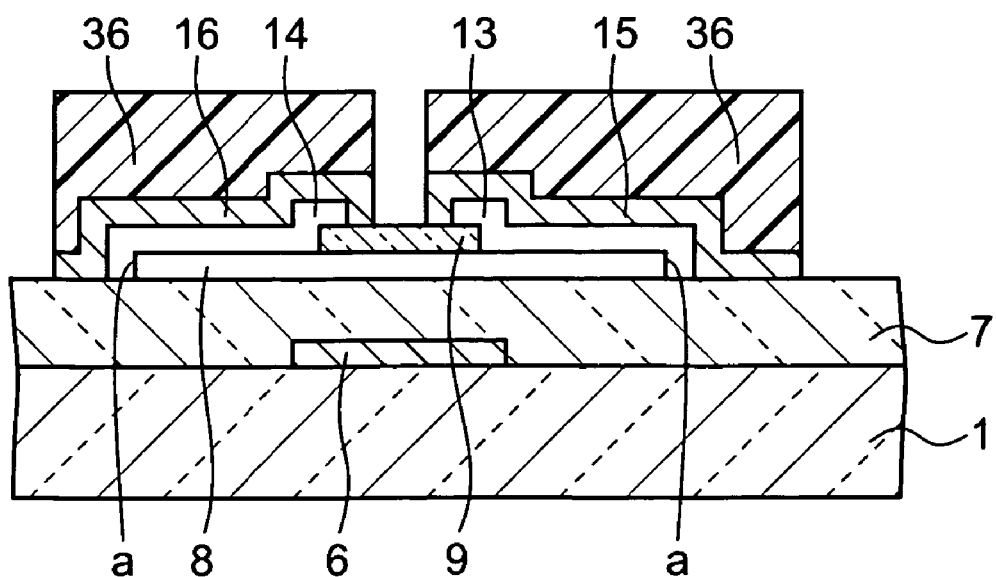
FIG. 22B is a cross sectional view cut along a substantially central line in a channel width direction of the thin film transistor illustrated in FIG. 22A.

Next, when the source and drain electrode forming layer 35 is etched using the resist pattern 36 as a mask, the source electrode 15, the drain electrode 16, and the data line 5 are formed under the resist pattern 36 as illustrated in FIGS. 22A and 22B. Sequentially, the resist pattern 36 is stripped using a resist stripper.

In this case, the ohmic contact layers 13 and 14 are completely covered with the source electrode 15 and the drain electrode 16. Accordingly, after the source and drain electrode forming layer 35 is film-formed, the ohmic contact layers 13 and 14 are completely protected without being exposed to the etchant for etching the source and drain electrode forming layer 35 and the resist stripper. This makes it possible to improve machining accuracy.

Next, as illustrated in FIGS. 14A and 14B, on the upper surface of the gate insulating film 7 including the source electrode 15, the drain electrode 16 and the data line 5, the overcoat film 17 made of silicon nitride is formed by plasma CVD. Sequentially, on a predetermined portion of the overcoat film 17, the contact hole 18 is formed by photolithography. After that, on a predetermined portion of the overcoat film 17, the pixel electrode 2 is formed such a manner that the pixel electrode forming layer, which is formed by sputtering and which is made of transparent conductive material such as ITO, etc., is patterned by photolithography to connect the pixel electrode 2 to the source electrode 15 through the contact hole 18.

In the fourth embodiment, the semiconductor thin film 8 is formed after forming the protection film 9, thus allowing the use of the method for forming the resist pattern 31, which is used in forming the protection film 9, by back exposure (exposure from the lower surface side of the glass substrate 1) using the gate electrode 5 as a mask. As a result, miniaturization in the thin film transistor 3 and reduction in variations of machining can be achieved.

Fifth Embodiment

Figure 23A:
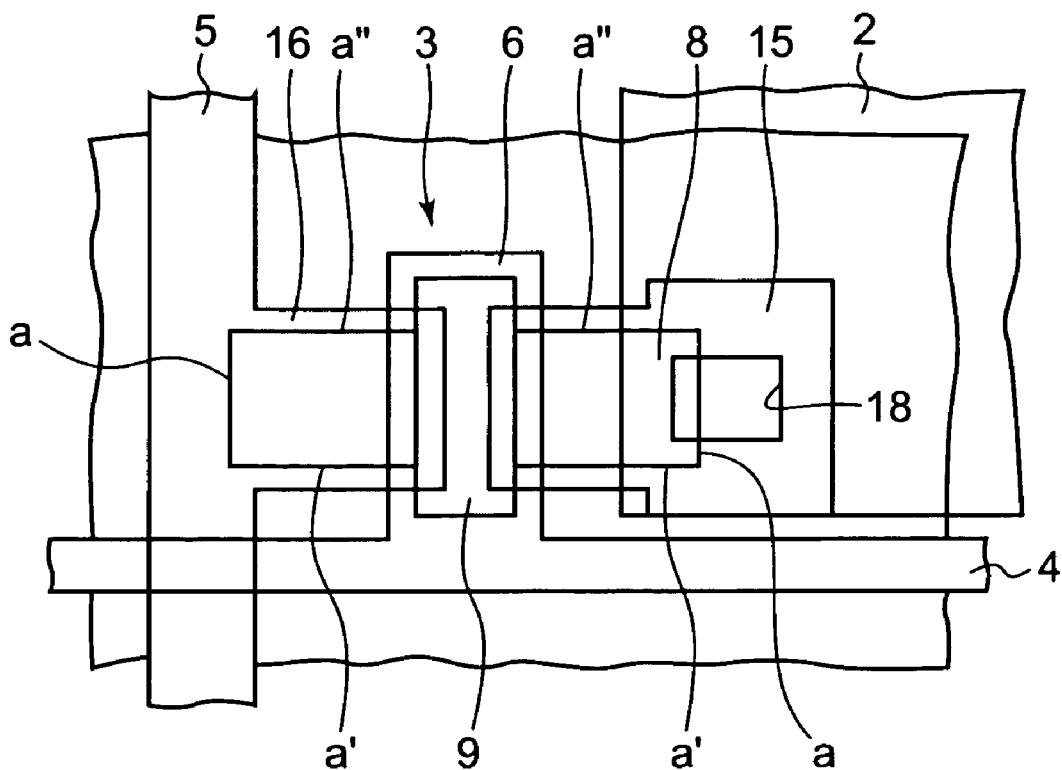
FIG. 23A is a transparent plan view illustrating a principal part of a liquid crystal display device having a thin film transistor according to a fifth embodiment of the present invention.
Figure 23B:
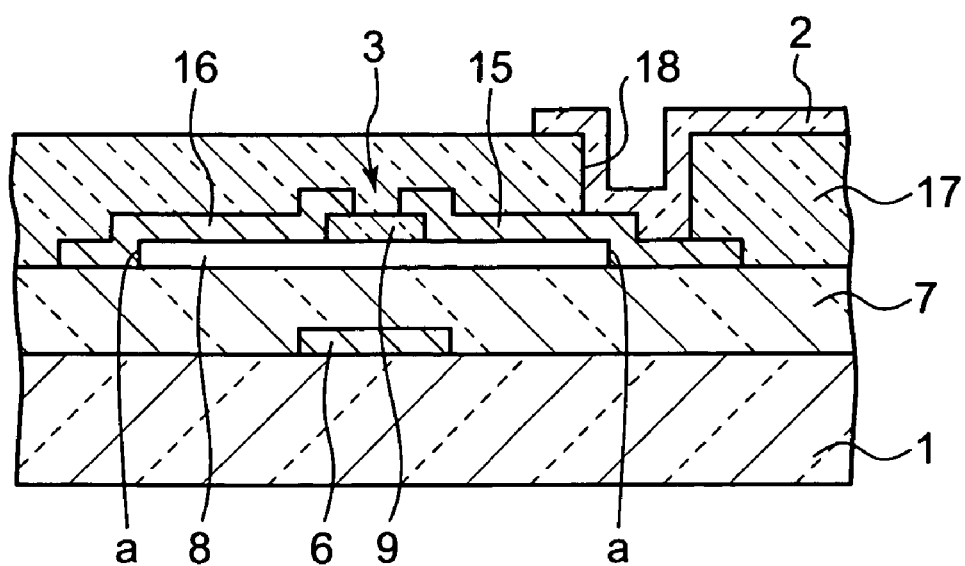
FIG. 23B is a cross sectional view cut along a substantially central line in a channel width direction of the thin film transistor illustrated in FIG. 23A.

FIG. 23A is a transparent plan view illustrating a principal part of a liquid crystal display device having a thin film transistor according to a fifth embodiment of the present invention, and FIG. 23B is a cross sectional view cut along a substantially central line in a channel width direction of the thin film transistor illustrated in FIG. 23A. The liquid crystal display device of the present embodiment is different from that illustrated in FIGS. 14A and 14B in the following point. Namely, no ohmic contact layers 13 and 14 are provided, and the source electrode 15 and the drain electrode 16 are directly connected to the semiconductor thin film 8.

However, in this case, in order to obtain more satisfactory contact, the semiconductor thin film 8 exposed without being covered with the protection film 9 may be subjected to resistance reduction. For example, after the process illustrated in FIGS. 18A and 18B, the resist pattern 32 is stripped, and thereafter ion doping or chemicals treatment is performed using the protection film 9 as a mask. Or, after film-forming the source and drain electrode forming layer 33, thermal diffusion is performed using the protection film 9 as the mask. As a result, the semiconductor thin film 8 exposed without being covered with the protection film 9 can be subjected to resistance reduction.

Accordingly, in the fifth embodiment, the process for forming the ohmic contact layers 13 and 14 becomes unnecessary. Moreover, even when the semiconductor thin film 8 exposed without being covered with the protection film 9 is subjected to resistance reduction, this resistance reduction can be performed using the protection film 9 as a mask to make it possible to reduce the number of processes as a whole.

Furthermore, in the fifth embodiment, since the ohmic contact layers 13 and 14 (see FIGS. 14A and 14B) larger than the semiconductor thin film 8 exposed without being covered with the protection film 9 are not provided, the semiconductor thin film 8 exposed without being covered with the protection film 9 may be covered with the source electrode 15 and the drain electrode 16.

As a result, as compared with the case illustrated in FIGS. 14A and 14B, the source electrode 15 and the drain electrode 16 can be reduced to some extent. Also, the space between the source electrode 15 and the drain electrode 16 can be reduced to some extent and the thin film transistor 3 can be miniaturized to some extent, and the size of the pixel electrode 2 can be increased to some extent.

Sixth Embodiment

Figure 24A:
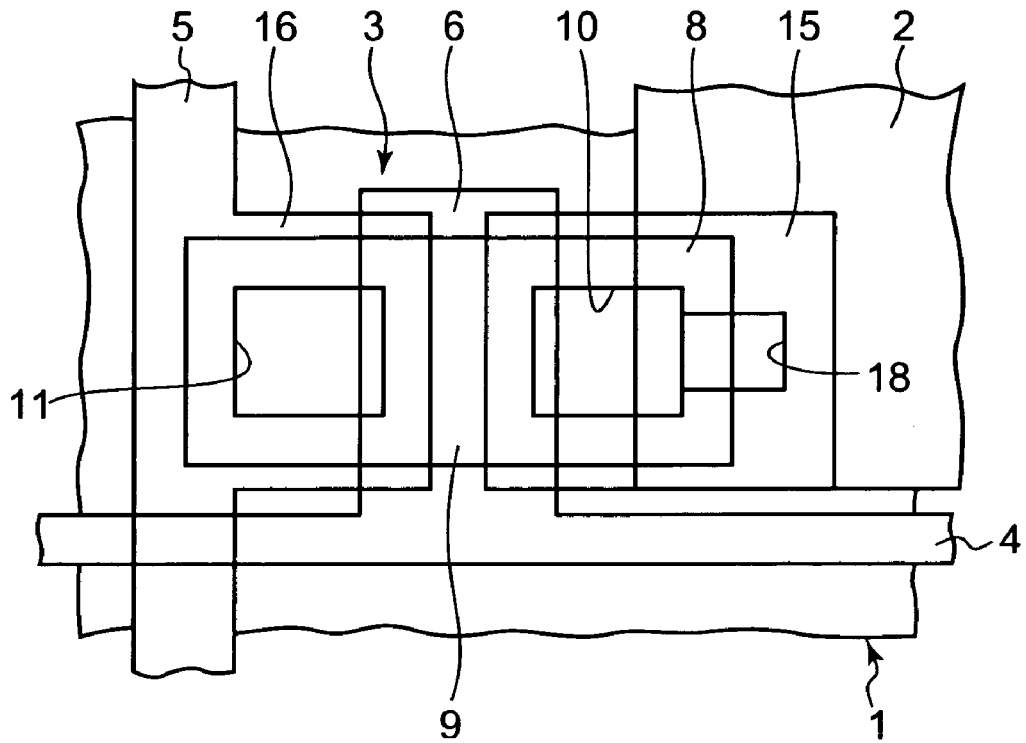
FIG. 24A is a transparent plan view illustrating a principal part of a liquid crystal display device having a thin film transistor according to a sixth embodiment of the present invention.
Figure 24B:
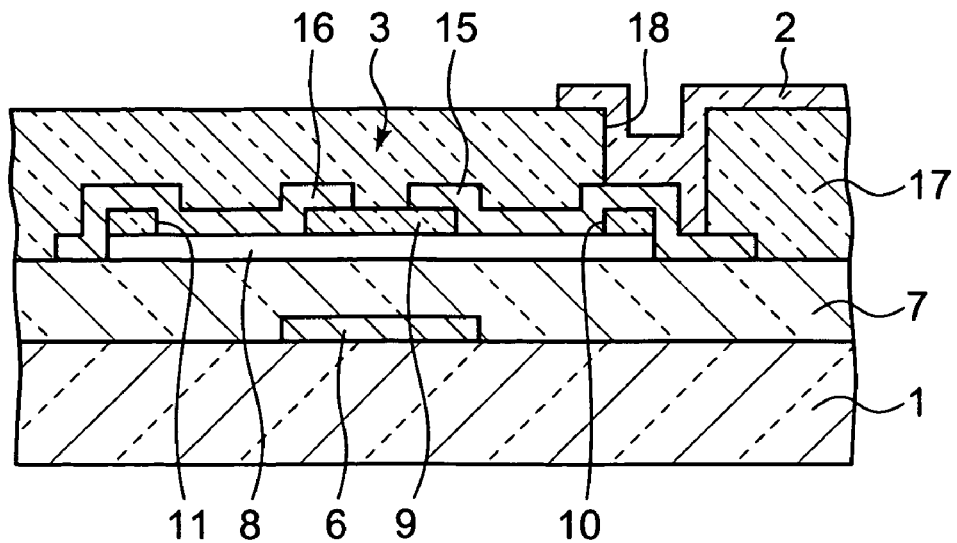
FIG. 24B is a cross sectional view cut along a substantially central line in a channel width direction of the thin film transistor illustrated in FIG. 24A.

The aforementioned third embodiment has explained the structure including the ohmic contact layers 13 and 14 as an example. However, the present invention is not limited to this, and the ohmic contact layers 13 and 14 can be omitted as illustrated in FIGS. 24A and 24B, similar to the second embodiment. FIG. 24A is a transparent plan view illustrating a principal part of a liquid crystal display device having a thin film transistor according to a sixth embodiment of the present invention, FIG. 24B is a cross sectional view cut along a substantially central line in a channel width direction of the thin film transistor illustrated in FIG. 24A. The source electrode 15 and the drain electrode 16 are directly connected to the semiconductor thin film 8 through the contact holes 10 and 11. In the case of the semiconductor thin film 8 made of a metal oxide such an intrinsic zinc oxide, when the source electrode 15 and the drain electrode 16 are formed of ITO, the ohmic contact can be obtained therebetween. Additionally, in order to obtain more satisfactory contact, the semiconductor thin film 8 exposed through the contact holes 10 and 11 may be subjected to resistance reduction.

Accordingly, in the sixth embodiment, the process for forming the ohmic contact layers 13 and 14 becomes unnecessary. Moreover, even when the semiconductor thin film 8 exposed through the contact holes 10 and 11 is subjected to resistance reduction, this resistance reduction can be performed using the protection film 9 as a mask to make it possible to reduce the number of processes as a whole.

Furthermore, omission of the ohmic contact layers 13 and 14 allows the contact holes 10 and 11 to be covered with the source electrode 15 and the drain electrode 16. Accordingly, as compared with the case illustrated in FIGS. 13A and 13B, the source electrode 15 and the drain electrode 16 can be reduced to some extent. Also, the space between the source electrode 15 and the drain electrode 16 can be reduced to some extent and the thin film transistor 3 can be miniaturized to some extent, and the size of the pixel electrode 2 can be increased to some extent.

Other Embodiment

The aforementioned embodiments have explained the case in which the semiconductor thin film forming layer 8a and the ohmic contact forming layers 23 and 33 are film-formed by plasma CVD. However, the present invention is not limited to these embodiments. For example, sputtering, vacuum deposition, casting, and plating may be used. Moreover, the ohmic contact layers 13 and 14 may be formed of the p-type zinc oxides without limiting to the n-type zinc oxides, and a zinc oxide whose conductivity is changed by causing oxygen deficiency may be possible.

According to the present invention, the insulating film having the same shaped end surface as that of the semiconductor thin film is formed on the peripheral portion of the semiconductor thin film, and the source electrode and the drain electrode are connected to the semiconductor thin film exposed from the insulating film, thereby making it possible to improve machining accuracy without causing any problem even if side etching slightly occurs on the semiconductor thin film.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A thin film transistor comprising:
   a semiconductor thin film including a source region, a drain region, and a channel region, the semiconductor thin film comprising a peripheral edge and a peripheral portion which is adjacent to the peripheral edge;
   a gate insulating film formed on a first surface of the semiconductor thin film;
   a gate electrode formed to be opposite to the semiconductor thin film with the gate insulating film therebetween;
   a source electrode and a drain electrode electrically connected to the semiconductor thin film; and
   an insulating film which: (i) is formed on a second surface of the semiconductor thin film, (ii) comprises a peripheral portion covering the peripheral portion of the semiconductor thin film and a peripheral edge having a same shape as the peripheral edge of the semiconductor thin film, and (iii) has contact holes through which at least a part of each of the source region and the drain region is exposed,
   wherein the source electrode and the drain electrode are connected to the semiconductor thin film through the contact holes.

2. The thin film transistor according to claim 1, wherein the insulating film has a central portion corresponding to the channel region of the semiconductor thin film.

3. The thin film transistor according to claim 2, further comprising:
   an ohmic contact layer formed on the source region of the semiconductor thin film which is exposed from one of the contact holes; and
   an ohmic contact layer formed on the drain region.

4. The thin film transistor according to claim 3, wherein the source electrode completely covers the ohmic contact layer formed on the source region, and the drain electrode completely covers the ohmic contact layer formed on the drain region.

5. The thin film transistor according to claim 1, wherein the source region and the drain region of the semiconductor thin film each comprise a resistance-reduced surface, and the source electrode and the drain electrode are directly connected to the resistance-reduced surface of the source region and the resistance-reduced surface of the drain region, respectively.

6. The thin film transistor according to claim 1, further comprising an upper insulating film having contact holes placed at positions corresponding to the contact holes of the insulating film, wherein the upper insulating film is formed on the insulating film.

7. The thin film transistor according to claim 6, wherein a surface of said part of each of the source region and the drain region of the semiconductor thin film exposed from the contact holes is subjected to resistance reduction.

8. The thin film transistor according to claim 7, wherein the source electrode and the drain electrode are directly connected to the resistance-reduced surface of the source region and the resistance-reduced surface of the drain region, respectively.

9. The thin film transistor according to claim 6, further comprising:
   ohmic contact layers connected to the semiconductor thin film through the contact holes formed on each of the upper insulating film and the insulating film.

10. The thin film transistor according to claim 9, wherein the source electrode and the drain electrode are respectively formed on the ohmic contact layers to completely cover the ohmic contact layers.

11. A thin film transistor comprising:
    a semiconductor thin film including a source region, a drain region and a channel region;
    a gate insulating film formed on one surface of the semiconductor thin film;
    a gate electrode formed to be opposite to the semiconductor thin film with the gate insulating film therebetween;
    an ohmic contact layer formed on each of the source region and the drain region of the semiconductor thin film; and
    an insulating film formed on the channel region of the semiconductor thin film corresponding to the gate electrode,
    wherein a width of the channel region is larger than a width of at least one of the source region and the drain region, and
    wherein the ohmic contact layer is formed to cover an upper surface end portion of the insulating film, an upper surface of the semiconductor thin film, and an end surface of the semiconductor thin film in a channel direction, except for a portion of the channel region.

12. The thin film transistor according to claim 11, further comprising a source electrode and a drain electrode which completely cover the ohmic contact layer.

13. The thin film transistor according to claim 12, further comprising an overcoat film that covers the source electrode, the drain electrode, and a portion of the insulating film that is placed between the source electrode and the drain electrode.

14. A thin film transistor comprising:
a semiconductor thin film comprising a source region, a drain region and a channel region;
a gate insulating film formed on one surface of the semiconductor thin film;
a gate electrode formed to be opposite to the semiconductor thin film with the gate insulating film therebetween;
a source electrode and a drain electrode electrically connected to the semiconductor thin film; and
an insulating film formed on the channel region of the semiconductor thin film corresponding to the gate electrode,
wherein a width of the channel region is larger than a width of at least one of the source region and the drain region,
wherein the semiconductor thin film comprises an exposed resistance-reduced surface that is not covered with the insulating film, and
wherein the source electrode and the drain electrode are respectively formed to cover an upper surface end portion of the insulating film, an upper surface of the semiconductor thin film, and an end surface of the semiconductor thin film in a channel direction, except for a portion of the channel region.

15. The thin film transistor according to claim 14, wherein the source electrode and the drain electrode are directly connected to the resistance-reduced surface of the semiconductor thin film.

16. The thin film transistor according to claim 14, further comprising an overcoat film that covers the source electrode, the drain electrode, and a portion of the insulating film that is placed between the source electrode and the drain electrode.

* * * * *